United States Patent
Yamazaki et al.

(10) Patent No.: US 6,331,475 B1
(45) Date of Patent: Dec. 18, 2001

(54) METHOD AND MANUFACTURING SEMICONDUCTOR DEVICE

(75) Inventors: Shunpei Yamazaki, Tokyo; Satoshi Teramoto, Kanagawa; Jun Koyama, Kanagawa; Akiharu Miyanaga, Kanagawa, all of (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/190,408

(22) Filed: Oct. 23, 1998

(30) Foreign Application Priority Data

| Jan. 12, 1995 | (JP) | 7-199079 |
|---|---|---|
| Jun. 2, 1995 | (JP) | 7-159976 |
| Jun. 2, 1995 | (JP) | 7-160002 |
| Dec. 15, 1995 | (JP) | 7-347821 |

(51) Int. Cl.7 .............................. H01L 21/20; H01L 21/36
(52) U.S. Cl. ............................................. 438/479; 438/491
(58) Field of Search ..................................... 438/166, 471, 438/478, 477, 479; 427/578; 257/66; 349/39

(56) References Cited

U.S. PATENT DOCUMENTS

| 4,659,392 | 4/1987 | Vasudev | 438/412 |
| 4,814,292 | * 3/1989 | Sasaki et al. | 438/166 |
| 5,147,826 | * 9/1992 | Liu et al. | 438/486 |
| 5,275,851 | * 1/1994 | Fronash et al. | 438/479 |
| 5,278,093 | 1/1994 | Yonehara | 438/479 |

(List continued on next page.)

FOREIGN PATENT DOCUMENTS

| 6-232069 | 8/1994 | (JP) . |
| 07-094757 | 4/1995 | (JP) . |
| 07-099323 | 4/1995 | (JP) . |
| 07-183538 | 7/1995 | (JP) . |
| 070516 | 7/1996 | (TW) . |
| 074427 | 2/1997 | (TW) . |

OTHER PUBLICATIONS

Fuse et al., "Perfomance of Poly–Si Thin Film Transistors Fabricated by Excimer Laser Annealing of SiH4– and Si2H6–Source Low Pressure Vapor Deposited a–Si Films With or Without Solid–Phase Crystallization," Solid State Phenomena, vol. 37–38, 1994, 1994.

Bonnel et al., "Polycrystalline Silicon Thin–Filmi Transistors With Two–Step Annealing Process," IEEE Electron Device Letters, vol. 14, No. 12, Dec. 1993, pp. 551–553, 12/1993.

Caune et al., "Combined CW Laser and Furnace Annealing of Amorphous Si and Ge in Contact With Some Metals," Applied Surface Science, vol. 36, 1989, pp. 567–604.

Nam et al., "Thin–Film Transistors With Polycrystalline Silicon Prepared by a New Annealing Method," Jpn. J. Appl. Phys., vol. 32, 1993, pp. 1908–1912, 1993.

(List continued on next page.)

*Primary Examiner*—Long Pham
*Assistant Examiner*—William David Coleman
(74) *Attorney, Agent, or Firm*—Fish & Richardson P.C.

(57) ABSTRACT

In producing a thin film transistor (TFT), an silicon oxide film is formed as an under film on a glass substrate, and then an amorphous silicon film is formed therein. A metal element which promotes crystallization of silicon is disposed in contact with a surface of the amorphous silicon film. A thermal processing for the amorphous silicon film is performed at a crystallization temperature of the amorphous silicon film or higher. At the thermal processing, a glass substrate is placed on an object having constant flatness. Cooling is performed to obtain a crystalline silicon film wherein the substrate is not distorted and deformed.

30 Claims, 15 Drawing Sheets

U.S. PATENT DOCUMENTS

| | | | |
|---|---|---|---|
| 5,300,187 | * | 4/1994 | Lesk et al. .............................. 438/477 |
| 5,403,772 | * | 4/1995 | Zhang et al. .......................... 438/166 |
| 5,424,230 | | 6/1995 | Wakai .................................... 438/166 |
| 5,492,843 | * | 2/1996 | Adachi et al. ......................... 438/478 |
| 5,529,937 | * | 6/1996 | Zhang et al. .......................... 438/471 |
| 5,529,951 | | 6/1996 | Noguchi et al. ....................... 438/487 |
| 5,543,352 | | 8/1996 | Ohtani et al. .......................... 438/487 |
| 5,561,081 | | 10/1996 | Takenouchi et al. ................... 437/174 |
| 5,569,610 | | 10/1996 | Zhang et al. . |
| 5,576,222 | | 11/1996 | Arai et al. .............................. 438/455 |
| 5,581,092 | * | 12/1996 | Takemura ............................... 257/65 |
| 5,585,291 | | 12/1996 | Ohtani et al. . |
| 5,597,741 | | 1/1997 | Sakamoto et al. .................... 438/532 |
| 5,614,733 | | 3/1997 | Zhang et al. . |
| 5,663,077 | * | 9/1997 | Hiroki Adachi et al. ............ 438/151 |
| 5,729,308 | * | 3/1998 | Yamazaki et al. ...................... 349/39 |
| 5,731,613 | | 3/1998 | Yamazaki et al. . |
| 5,783,468 | | 7/1998 | Zhang et al. . |
| 5,789,762 | * | 8/1998 | Koyama et al. ......................... 257/66 |
| 5,837,619 | | 11/1998 | Adachi et al. . |
| 5,854,096 | | 12/1998 | Ohtani et al. .......................... 438/166 |
| 5,858,823 | | 1/1999 | Yamazaki et al. . |
| 5,879,977 | | 3/1999 | Zhang et al. . |
| 5,915,174 | | 6/1999 | Yamazaki et al. . |
| 5,959,313 | | 9/1999 | Yamazaki et al. . |
| 5,987,347 | * | 4/1999 | Yamazaki et al. ................... 438/166 |

OTHER PUBLICATIONS

C. Hayzelden et al., "In Situ Transmission Electron Microscopy Studies of Silicide–Mediated Crystallization of Amorphous Silicon" (3 pages).

A.V. Dvurechenskii et al., "Transport Phenomena in Amorphous Silicon Doped by Ion Implantation of 3d Metals," *Akademikian Lavrentev Prospekt* 13 , 630090 Novosibirsk 90, USSR, pp. 635–640.

T. Hempel et al., "Needle–Like Crystallization of Ni Doped Amorphous Silicon Thin Films," *Solid State Communications*, vol. 85, No. 11, pp. 921–924, 1993.

"Crystallized Si Films By Low–Temperature Rapid Thermal Annealing of Amorphous Silicon," R. Kakkad, J. Smith, W.S. Lau, S.J. Fonash, J. Appl. Phys. 65(5), Mar. 1, 1989, 1989 American Institute of Physics, pp. 2069–2072.

"Polycrystalline Silicon Thin Film Transistors on Corning 7059 Glass Substrates Using Short Time, Low Temperature Processing," G. Liu, S.J. Fonash, Appl. Phys. Lett. 62 (20), May 17, 1993, 1993 American Institute of Physics, pp. 2554–2556.

"Selective Area Crystallization of Amorphous Silicon Films by Low–Temperature Rapid Thermal Annealing," Gang Liu and S.J. Fonash, Appl. Phys. Lett. 55 (7), Aug. 14, 1989, 1989 American Institute of Physics, pp. 660–662.

"Low Temperature Selective Crysatllization of Amorphous Silicon," R. Kakkad, G. Liu, S.J. Fonash, Journal of Non–Crystalline Solids, vol. 115, (1989) pp. 66–68.

* cited by examiner

|  | Embodiment | Comparative Example 1 | Comparative Example 2 |
|---|---|---|---|
| Crystallization Condition | 800 °C, 4 hours | 800 °C, 4 hours | 550 °C, 4 hours |
| Nickel | Used | Not Used | Used |
| Mobility ($cm^2$/Vs) | 180 to 250 | 140 to 170 | 100 to 150 |
| S Value (V/Dec) | 0.09 to 0.12 | 0.2 to 0.3 | 0.2 to 0.3 |

*FIG. 10*

HEATING TREATMENT FOR CRYSTALLIZATION

HEATING TREATMENT IN ATMOSPHERE
CONTAINING CHLORINE

METHOD AND MANUFACTURING SEMICONDUCTOR DEVICE

BACKGROUND OF THE INVENTION

1. Field of the Invention

The present invention relates to a method of producing a semiconductor device such as a thin film transistor (TFT), and more particularly to a method of producing a semiconductor device using a crystalline silicon film on a substrate having an insulating surface.

2. Description of the Related Art

In recent years, attention has been paid to a technique by which a thin film transistor (TFT) is formed using a silicon thin film formed on a glass substrate. The TFT is primarily used for a liquid crystal electro-optical device of the active matrix type. Also, the TFT is used for a variety of thin film integrated circuits.

The liquid crystal electro-optical device is designed such that liquid crystal is sealingly interposed between a pair of glass substrates, and the optical characteristic of the liquid crystal is changed by the application of an electric field to the liquid crystal, to display an image.

The liquid crystal display unit of the active matrix type for which the TFT is used is characterized in that a TFT is arranged in each pixel, and the charges stored by a pixel electrode are controlled by the TFT that functions as a switch. The liquid crystal display unit of the active matrix type is used as a display for various electronic devices (for example, a portable word processor or a portable computer) because it is capable of displaying a fine image at high speed.

The TFT used in the liquid crystal display unit of the active matrix type is generally produced on a transparent substrate such as a quartz substrate or a glass substrate and uses an amorphous silicon thin film. However, the TFT using the amorphous silicon thin film has problems stated below.

(1) The characteristic is low, and image display with higher quality cannot be performed.

(2) A peripheral circuit for driving a TFT disposed in each pixel cannot be constructed.

As a method for solving the problems (1) and (2), there is a technique for producing the TFT using a crystalline silicon thin film. As a method for obtaining the crystalline silicon thin film, after the amorphous silicon film is formed on a glass substrate or a quartz substrate by plasma CVD or low pressure CVD, there is a method that an amorphous silicon film is thermally treated, and a method that a laser beam is irradiated onto an amorphous silicon film.

The problem (2) is considered to be classified into such a problem that a CMOS circuit cannot be constructed since the TFT using the amorphous silicon thin film does not put a p-channel type TFT into practical use, and such a problem that the peripheral drive circuit cannot be assembled since the TFT using the amorphous silicon thin film cannot operate at high speed and also a large current cannot flow therein.

As a method in which the amorphous silicon film is crystallized by a heat treatment, there has been known a structure disclosed in Japanese Patent Unexamined Publication No. 6-232069. This method enables a crystalline silicon film to be obtained under a condition in which a heat treatment is conducted at 550° C. for 4 hours, using a metal element such as nickel which promotes the crystallization of silicon. Hence, the crystalline silicon film can be formed even on a glass substrate lower in heat resistance than a quartz substrate.

However, according to the above publication, there arises an unsatisfactory matter in the crystallinity of a crystalline silicon film to be obtained. In other words, the crystallinity of the crystalline silicon film to be obtained is low, which causes a large amount of amorphous silicon components to remain.

Also, if the heat treatment conditions are 550° C. and 4 hours, the crystalline silicon film can be formed at a level where no problem is caused by distortion or deformation of a glass substrate of about 10 inches in size, using a metal element such as nickel. However, there is a demand that the liquid crystal display unit is increased in area, and it is expected that a liquid crystal display device of 20 inches, further 30 inches or more diagonally will be produced. In such a large area, the distortion or deformation of the glass substrate causes a problem even by the technique disclosed in the Japanese Patent Unexamined Publication No. 6-232069 is used.

The liquid crystal electro-optical device is so designed as to interpose a liquid crystal between a pair of glass substrates with an interval of several $\mu$m. Thus, the distortion of $\mu$m order between the edges of the substrate causes the thickness of a liquid crystal layer to be changed. This causes the nonuniformity of display and so on. Also, in producing a semiconductor integrated circuit formed on a glass substrate, the problem leads to the lowering of a yield accompanied by the failure of exposure or the failure of substrate transportation.

In the Japanese Patent Unexamined Publication No. 6-232069, there is observed such a phenomenon that a metal element such as nickel as used is locally concentrated in the crystalline silicon film. This phenomenon comes to a factor that leads to a defect when constituting the device. Also, this becomes a factor that lowers the yield of production.

Further, as a technique in which an amorphous silicon film is transformed into a crystalline silicon film, there has been known a technique in which a laser beam is irradiated onto the amorphous silicon film. The irradiation of a laser beam enables the crystalline silicon film partially high in crystallinity to be obtained. However, it is difficult to obtain the effect caused by the irradiation of a laser beam with high reproducibility, and also it is difficult to obtain the crystalline silicon film over a large area.

SUMMARY OF THE INVENTION

An object of the present invention disclosed in the specification is to provide a technique in which a crystalline silicon film excellent in crystallinity is formed on an insulating surface of a glass substrate, a quartz substrate or the like, and particularly to provide a technique in which a crystalline silicon film with high crystallinity is formed on the glass substrate in a state where the flatness of the glass substrate is maintained.

Another object of the present invention is to solve the above problems, and to provide a method of producing a semiconductor, so as to obtain a crystalline silicon film in which a metal element is not locally concentrated in the case where an amorphous silicon film is crystallized using the metal element that promotes the crystallization of silicon.

To solve the above problems, according to the present invention, there is provided a method of producing a semiconductor device including the steps of: disposing metal elements that promote the crystallization of silicon in contact with the surface of an amorphous silicon film formed on an insulating surface; and subjecting the amorphous silicon film to a thermal processing at a temperature of the crystallization temperature or higher of the amorphous silicon film to crystallize the amorphous silicon film.

In the above structure, the substrate having the insulating surface may be formed of a glass substrate, a glass substrate on which an insulating film is formed, or a semiconductor substrate on which an insulating film is formed.

The amorphous silicon film may be formed by plasma CVD or low pressure thermal CVD. The amorphous silicon film formed by low pressure thermal CVD is preferable because hydrogen contained therein is little, and it can be crystallized easily.

The metal element that promotes the crystallization of silicon may be one kind or plural kinds of elements selected from Fe, Co, Ni, Ru, Rh, Pd, Os, Ir, Pt, Cu and Au. The use of Ni (nickel) in the metal elements is preferable because its effect is high and the reproducibility is high.

The crystallization temperature of the amorphous silicon film depends on a method or condition of forming the silicon film. Since crystallization is made by a long heating time even at a low temperature, there is no definite boundary of a temperature at which the crystallization starts. Even the amorphous silicon film which is crystallized by heating at 600° C. for 24 hours can be transformed into a complete crystalline silicon film by a heat treatment at 580° C. for 96 hours.

In the above structure, a temperature at which the overall amorphous silicon film is crystallized in the heat treatment for 12 hours is defined as a crystallization temperature. In this specification, that the overall amorphous silicon film is crystallized is directed to a state in which 80% or more of the overall amorphous silicon film is transformed into a crystalline component. Also, the state in which the overall amorphous silicon film is crystallized may be a state in which the spectrum of the amorphous component hardly appears through the measurement of Raman spectroscopy, and the spectrum of the crystalline component becomes remarkable.

According to the present invention, there is provided a method of producing a semiconductor device including the steps of: disposing metal elements that promote crystallization of silicon in contact with the surface of an amorphous silicon film formed on an insulating surface; subjecting the amorphous silicon film to a thermal processing at a temperature which is a strain point or higher of the glass substrate and an annealing point or lower of the glass substrate to crystallize the amorphous silicon film; and cooling the crystallized silicon film at 1° C./min or lower until a 500° C. or lower after the thermal processing.

In the above structure, the step of thermally processing the amorphous silicon film at a temperature which is a strain point or higher of the glass substrate, and an annealing point or lower of the glass substrate, to crystallize the amorphous silicon film is because a stress in the glass substrate is released so as to prevent the glass substrate from being strained, deformed or contracted later. It is not preferable to conduct the heat treatment at the strain point or lower of the glass substrate because its effect is small. Also, it is not preferable to conduct the heat treatment at the annealing point or higher. This is because the generation of a new stress is observed. The annealing point is a temperature at which the viscosity is $4\times10^{14}$ poise and an upper limit temperature when removing the distortion in glass. In this temperature, the stress in glass disappears after several to ten several minutes because of the viscous flow.

Also, the reason why cooling is conducted at 1° C./minute or lower is to prevent the substrate from being distorted or deformed by a stress generated by cooling. The cooling temperature is preferably as low as possible for the purpose of releasing the stress. However, the low cooling temperature leads to such an economical problem that a processing time becomes long. The cooling is necessary to conduct up to 500° C. or lower. However, the cooling of even a room temperature is not economical because it takes time.

The heating and cooling are effective when they are conducted on a base object (substrate) that a flatness is ensured. This is because the glass substrate is largely affected by the state of the surface of the base object on which the glass substrate is located when heating is conducted at a temperature which is the strain point or higher of the glass substrate and the annealing point or lower. In the case where the glass substrate is located on the curved base object and the heating treatment is conducted, the glass substrate is deformed into a shape which is along the shape of the curved base object. Conversely, when the heat treatment is conducted using the base object that the flatness is ensured, the glass substrate is formed into a shape which is along the flatness of the base object, to obtain the glass substrate excellent in flatness.

Since the above fact is also applied to a case when cooling starts, it is important to dispose the glass substrate on the object that the flatness is ensured even in the cooling process.

According to the present invention, there is provided a method of producing a semiconductor device including the steps of: disposing metal elements that promote the crystallization of silicon in contact with the surface of an amorphous silicon film formed on a glass substrate; subjecting the amorphous silicon film to a thermal processing at a temperature which is a crystallization temperature or higher of the amorphous silicon film, a strain point or higher of the glass substrate and an annealing point or lower of the glass substrate to crystallize the amorphous silicon film; and cooling the crystallized silicon film at 1° C./min or lower until 500° C. or lower after the thermal processing.

In the method of producing the semiconductor device having the above steps, in the state where the metal elements that promote the crystallization of silicon are disposed in contact with the surface of the amorphous silicon film, the amorphous silicon film is thermally processed at a temperature which is the crystallization temperature or higher of the amorphous silicon film, thereby obtaining a crystalline silicon film having a high crystallinity. The crystalline silicon film is higher in crystallinity than a crystalline silicon film obtained by simply giving heating to the amorphous silicon film as well as a crystalline silicon film obtained by heating the amorphous silicon film at a temperature which is the crystallization temperature or less of the amorphous silicon film in a state where the metal elements that promote the crystallization of silicon are disposed in contact with the surface of the amorphous silicon film.

The metal elements that promote the crystallization of silicon are disposed in contact with the surface of the amorphous silicon film formed on the glass substrate, and the heating treatment is conducted on the amorphous silicon film at a temperature which is the strain point or higher of the glass substrate and the annealing point or less of the glass substrate, and further a crystallized silicon film is cooled at 1° C./min or lower until 500° C. or lower, thereby obtaining a crystalline silicon film in a state where the stress in the glass substrate is released. In particular, in the heating and cooling processes, the glass substrate is disposed on the substrate that the flatness is ensured, thereby obtaining the crystalline silicon film on the glass substrate that the flatness is ensured.

The metal elements that promote the crystallization of silicon are disposed in contact with the amorphous silicon film formed on the glass substrate, and the heating treatment is conducted on the amorphous silicon film at a temperature which is a crystallization temperature or higher of the amorphous silicon film, a strain point or higher of the glass substrate and an annealing point or lower of the glass substrate, thereby obtaining a crystalline silicon film having a high crystallinity on the glass substrate where inside stress is released. In particular, in the heating process and the subsequent cooling process, the glass substrate is disposed on the object that the flatness is ensured, thereby obtaining the crystalline silicon film on the glass substrate that the flatness is ensured.

According to the present invention, there is provided a method of producing a semiconductor device including the steps of: disposing metal elements that promote the crystallization of silicon in contact with the surface of a silicon film which is formed on a quartz substrate; and thermally processing the silicon film at 800 to 1100° C. to transform the silicon film into a crystalline silicon film or promote the crystallinity of the silicon film.

According to the present invention, there is provided a method of producing a semiconductor device including the steps of: applying a solution containing metal elements that promote the crystallization of silicon on a silicon film formed on a quartz substrate; and thermally processing the silicon film at 800 to 1100° C. to transform the silicon film into a crystalline silicon film or promote the crystallinity of the silicon film.

According to the present invention, there is provided a method of producing a semiconductor device including the steps of: disposing metal elements that promote the crystallization of silicon in contact with the surface of an amorphous silicon film formed on a quartz substrate; and thermally processing the amorphous silicon film at 200° C. higher than a crystallization temperature of the amorphous silicon film to transform the amorphous silicon film into a crystalline silicon film.

According to the present invention, there is provided a method of producing a semiconductor device including the steps of: patterning an amorphous silicon film formed on a quartz substrate to form an island region having a diameter of 200 μm or less; disposing metal elements that promote the crystallization of silicon in contact with the surface of the island region; and thermally processing the island region at 800 to 1100° C. to crystallize the island region.

The substrate may be formed of a semiconductor substrate represented by a single-crystal silicon wafer instead of the quartz substrate. In the semiconductor substrate, there arise such a problem that the transmittivity of light cannot be ensured, and such a problem that it is necessary to form an insulating film on the surface of the semiconductor substrate.

In the present invention, a single layer film selected from a silicon oxide film, a silicon nitride film and a silicon nitride oxide film, or a multilayer film made up of those films, which is formed on the quartz substrate, is also called "substrate". In general, in order to release a stress generated between the quartz substrate and the semiconductor film, it is preferable to form an under film such as a silicon oxide film.

Also, the present invention can be applied to a technique in which an insulating film is formed on an integrated circuit using a silicon wafer (in general, called as "IC"), and a TFT is formed on the insulating film as an under film. That is, the silicon wafer (or a base object made of single-crystal silicon) on which the integrated circuit is formed as required for a substrate can be used as a base object.

The silicon film may be formed of an amorphous silicon film or a microcrystal silicon film. In particular, it is effective to use an amorphous silicon film, in which the contents of hydrogen is reduced as much as possible. Also, in order to artificially reduce the hydrogen in the amorphous silicon film, it is very effective to thermally process the amorphous silicon film at 300 to 500° C. for about 30 minutes to 2 hours to promote the elimination of hydrogen from the film. A heating treatment for crystallization may be conducted after the thermal processing for elimination of hydrogen.

In the method of producing the semiconductor device having the above steps in accordance with the present invention, the temperature of the heat treatment for crystallizing the silicon film formed on the quartz substrate or the silicon wafer or improving its crystallinity is preferably 800 to 1100° C. Also, in case of using the amorphous silicon film as a starting film, the temperature of the heat treatment is preferably set to a temperature which is higher than the crystallization temperature of the amorphous silicon by 200° C. or higher.

The crystallization temperature of the amorphous silicon film is different depending on the method or conditions for forming the silicon film. Since the crystallization is conducted on the amorphous silicon film by a long heat time even at a low temperature, there is no definite boundary of a temperature at which the crystallization starts. Even the amorphous silicon film which is barely crystallized by heating at 600° C. for 24 hours can be transformed into a complete crystalline silicon film by a heat treatment at 590° C. for 96 hours.

In the present invention, a temperature at which the overall amorphous silicon film is crystallized in the heat treatment for 12 hours is defined as a crystallization temperature. In this specification, that the overall amorphous silicon film is crystallized is directed to a state in which 80% or more of the overall amorphous silicon film is transformed into a crystalline component. Also, the state in which the overall amorphous silicon film is crystallized may be a state in which the spectrum of the amorphous component hardly appears through the measurement of Raman spectroscopy, and the spectrum of the crystalline component becomes remarkable.

The crystallization temperature of the amorphous silicon film is generally 580 to 620° C., although it depends on the film forming method or conditions.

The metal elements that promote the crystallization of silicon is used, and the heat treatment for obtaining the crystalline silicon film on the quartz substrate is conducted at a high temperature of 800 to 1100° C., thereby obtaining the crystalline silicon film having a high crystallinity by the heat treatment for a short time. Also, such a heat treatment at a high temperature is conducted, thereby preventing the metal elements from being locally concentrated in the silicon film.

According to the present invention, there is provided a method of producing a semiconductor device including the steps of: intentionally introducing metal elements that promote the crystallization of silicon into an amorphous silicon film to crystallize the amorphous silicon film by a first heat treatment; conducting a second heat treatment on the amorphous silicon film; and forming a silicon nitride oxide film on the silicon film; wherein the second heat treatment is conducted at a temperature which is the same as or higher than that of the first heat treatment.

In the above method, the second heat treatment is conducted at 550 to 1050° C., more preferably, at 600 to 980° C.

A laser light is irradiated after the second heat treatment, to form a single-crystal region or a substantially single-crystal-like region where no grain boundary substantially exists, with a spin density of $3\times10^{17}$ cm$^{-3}$ or less.

In the method of producing the semiconductor device having the above steps according to the present invention, after the heat treatment for the crystallization, another heat treatment is conducted at a temperature higher than that of the heat treatment for crystallization, thereby preventing the metal intentionally introduced into the film for promoting the crystallization of silicon from being locally concentrated.

In the present invention, a method of applying a solution containing the metal elements therein on the surface of the amorphous silicon film is optimum as the method of disposing the metal elements that promote crystallization of silicon in contact with the amorphous silicon film.

Using that method, the concentration of the metal element in the solution is adjusted so that the concentration of the metal element finally existing in the silicon film can be adjusted. The concentration of the metal element existing in the silicon film is necessarily set to the concentration of about $1\times10^{15}$ to $5\times10^{19}$ atoms cm$^{-3}$, preferably $1\times10^{16}$ to $5\times10^{17}$ atoms cm$^{-3}$. Thus, the above method using the solution is very useful. The concentration of the metal element is defined as a minimum value measured by SIMS (secondary ion mass spectrometry).

It has been found that the method using the solution permits the metal element to be disposed in uniform contact with the surface of the amorphous silicon film. This means that a layer of the metal element or a layer containing the metal element therein can exist in uniform contact with the amorphous silicon film. This becomes very important because it prevents the metal elements from being locally concentrated.

In case of using nickel as a metal element, a solution can be used which mainly contains at least one kind of nickel compound selected from nickel bromide, nickel acetate, nickel oxalate, nickel carbonate, nickel chloride, nickel iodide, nickel nitrate, nickel sulfate, nickel formate, nickel acetylacenate, nickel 4-cyclohexyl butyrate, nickel oxide, nickel hydroxide, and nickel 2-ethyl hexanoic acid.

Also, Ni may be mixed with at least one selected from benzene, toluene, xylene, carbon tetrachloride, chloroform, ether, trichloroethylene, or freon, all of which are non-polar solvents.

In case of using Fe (iron) as a metal element, its compound known as ion salt, for example, at least one kind of material selected from iron (I) bromide (FeBr$_2$ 6H$_2$O), iron (II) bromide (FeBr$_3$ 6H$_2$O), iron (II) acetate (Fe(C$_2$H$_3$O$_2$)$_3$xH$_2$O), iron (I) chloride (FeCl$_2$ 4H$_2$O), iron (II) chloride (FeCl$_3$ 6H$_2$O), iron (II) fluoride (FeF$_3$ 3H$_2$O), iron (II) nitrate (Fe(NO$_3$)$_3$ 9H$_2$O), iron (I) phosphorate (Fe$_3$(PO$_4$)$_2$ 8H$_2$O), and iron (II) phosphorate (FePO$_4$ 2H$_2$O) can be used as a main component.

In case of using Co (cobalt) as a metal element, its compound known as a cobalt salt, for example, a material selected from cobalt bromide (CoBr 6H$_2$O), cobalt acetate (Co (C$_2$H$_3$O$_2$)$_2$ 4H$_2$O), cobalt chloride (CoCl$_2$ 6H$_2$O), cobalt fluoride (CoF$_2$ XH$_2$O), and cobalt nitrate (Co(No$_3$)$_2$ 6H$_2$O) can be used as a main component.

In case of using Ru (ruthenium) as a metal element, its compound known as ruthenium salt, for example, ruthenium chloride (RuCl$_3$H$_2$O) can be used.

In case of using Rh (rhodium) as a metal element, its compound known as a rhodium salt, for example, rhodium chloride (RhCl$_3$ 3H$_2$O) can be used.

In case of using Pd (palladium) as a metal element, its compound known as a palladium salt, for example, palladium chloride (PdCl$_2$2H$_2$O) can be used.

In case of using Os (osmium) as a metal element, its compound known as osmium salt, for example, osmium chloride (OsCl$_3$) can be used.

In case of using Ir (iridium) as a metal element, its compound known as iridium salt, for example, a material selected from iridium trichloride (IrCl$_3$ 3H$_2$O) and iridium tetrachloride (IrCl$_4$) can be used as a main compound.

In case of using Pt (platinum) as a metal element, its compound known as platinum salt, for example, platinum (II) chloride (PtCl$_4$ 5H$_2$O) can be used.

In case of using Cu (copper) as a metal element, its compound, a material selected from copper (II) acetate (Cu (CH$_3$COO)$_2$), copper (II) chloride (CuCl$_2$ 2H$_2$O) and copper (II) nitrate (Cu(NO$_3$)$_2$ 3H$_2$O) can be used.

In case of using gold as a metal element, as its compound, a material selected from gold trichloride (AuCl$_3$ xH$_2$O) and gold nitride (AuHCl$_4$ 4H$_2$O) can be used.

In order to adjust the concentration of those metal elements, it is effective to dilute the above materials with an appropriate solvent. Also, it is effective to contain a surface active agent in the above solvent. The use of a surface active agent permits the metal elements to be dispersed on the surface of amorphous silicon film, thereby enhancing the effect that allows the metal elements to exist.

BRIEF DESCRIPTION OF THE DRAWINGS

FIG. 10 is a table showing the producing conditions and the characteristics between the embodiment and comparative examples;

DETAILED DESCRIPTION OF THE PREFERRED EMBODIMENTS (First Embodiment)

Figure 1A:
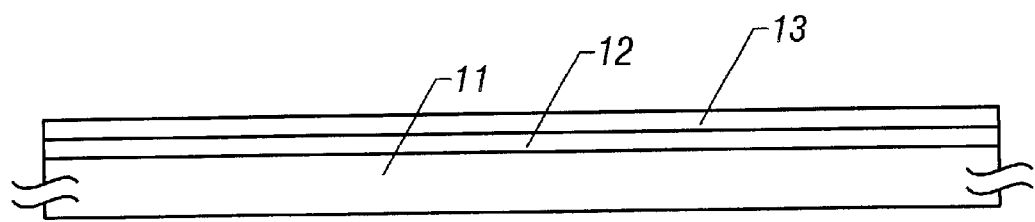
FIGS. 1A to 1D show a process of producing a crystalline silicon film according to an embodiment.

FIGS. 1A to 1D show a process of producing a thin film transistor (TFT) according to an embodiment. This embodiment is to form a crystalline silicon film on a glass substrate. A silicon oxide film 12 having a thickness of 3000 Å is formed-as an under film on a Corning 1737 glass substrate 11 (a strain point of 667° C., an annealing point of 721° C.) having a size of 20 cm square. Then, an amorphous silicon film 13 having a thickness of 500 Å is formed on the silicon oxide film 12 by low pressure thermal CVD. (FIG. 1A)

Figure 1B:
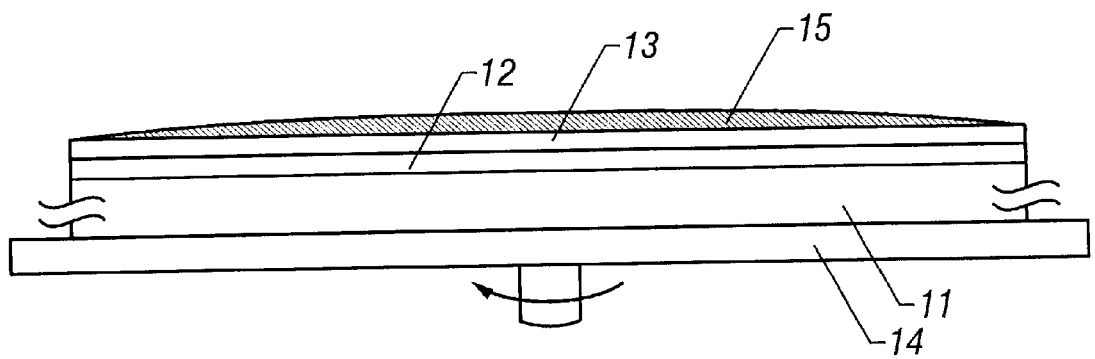

A nickel acetate solution having a desired concentration is applied on the surface of the amorphous silicon film 13, to form a water film 15 of the nickel acetate solution (FIG. 1B).

A spin coating is conducted using a spinner 14. At the same time, an excessive nickel acetate solution is blown off. In this way, nickel elements are disposed in contact with the surface of the amorphous silicon film 13. The concentration of the nickel elements in the nickel acetate solution is adjusted so that the concentration of the nickel elements existing in the silicon film is finally about $1 \times 10^{15}$ to $5 \times 10^{19}$ atoms cm$^{-3}$ or less.

The glass substrate is mounted on a board 16 which is a base object having a high precision plane. The board 16 is polished so that the roughness of its surface is 3 $\mu$m or less. The board 16 is made of quartz and is necessarily made of a material that will be less deformed in a subsequent heat treatment.

Figure 1C:
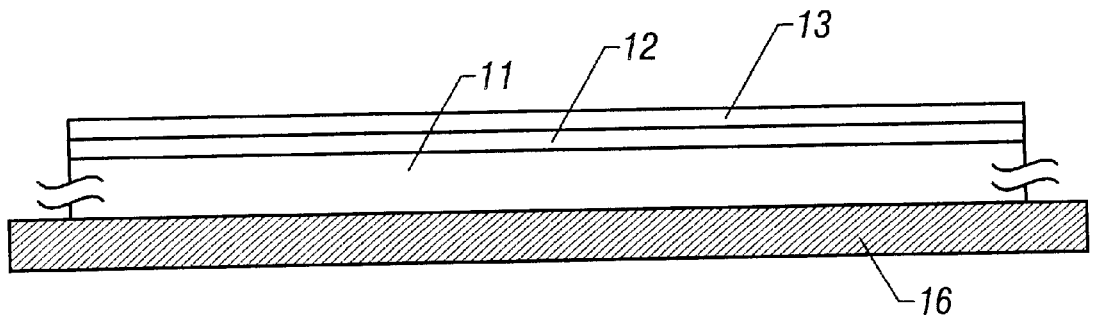

Thus, a state of FIG. 1C is obtained. In this state, the nickel elements are disposed in contact with the surface of the amorphous silicon film 13. Then, a heat treatment is conducted at 700° C. for 4 hours. After the heat treatment, cooling is conducted at a cooling rate of 5° C./minute until 400° C.

The temperature of the heat treatment is higher than the strain point (667° C.) of the Corning 1737 glass substrate 11 but lower than its annealing point (721° C.).

The temperature of the heat treatment is higher than the crystallization temperature of the amorphous silicon film 13. According to the experiment, it has been found that the crystallization temperature of the amorphous silicon film 13 in this embodiment is about 590° C.

As a result of the heat treatment, the amorphous silicon film 13 is crystallized, thereby obtaining a crystalline silicon film 17. As described above, when the glass substrate 11 is thermally processed at a temperature between its strain point or higher and its annealing point or less, the substrate 11 can be flattened in accordance with the flatness of the board 16. Also, in this heat treatment, since a stress in the substrate 11 is released, the substrate 11 can be suppressed from being strained or deformed in a subsequent process.

Figure 1D:
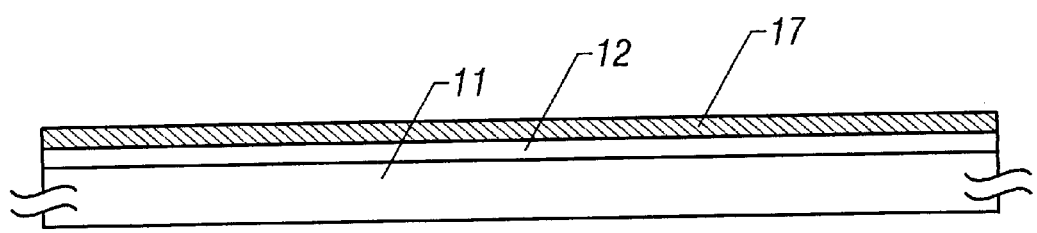

In the above manner, the crystalline silicon film 17 shown in FIG. 1D can be formed on the glass substrate 11. With the process shown in this embodiment, the crystalline silicon film 17 can be formed on the large area glass substrate 11 in a state where the strain or deformation of the substrate is suppressed.

Using nickel which is a metal element that promotes the crystallization of silicon, the crystalline silicon film 17 having a higher crystallinity than that of the crystalline silicon film crystallized by simply heating can be obtained. Also, since the crystallization can be conducted for a short time in comparison with the crystallization by simply heating, its reproductivity can be increased.

(Second Embodiment)

A second embodiment is an example in which a copper element is used instead of a nickel element in the process of the first embodiment. In this embodiment, the copper elements are disposed in contact with the surface of the amorphous silicon film 13, using copper (II) acetate (Cu(CH$_3$COO)$_2$). The concentration of the copper elements in the solution may be the same as in the case of the nickel elements used in the first embodiment. Also, others are the same as those in the first embodiment.

(Third Embodiment)

A third embodiment is an example in which a Corning 7059 glass substrate is used as the glass substrate 11 in the process in the first embodiment. The strain point of the Corning 7059 glass substrate is 593° C. and the annealing point thereof is 640° C. In this embodiment, the heat treatment in the process of FIG. 1C is conducted at 620° C. for 4 hours.

(Fourth Embodiment)

A fourth embodiment is an example in which an n-channel TFT is manufactured. A Corning 1737 glass substrate is used. A crystalline crystal film is formed on the glass substrate in accordance with the process in the first embodiment and then is patterned to obtain a state of FIG. 2A.

Figure 2A:
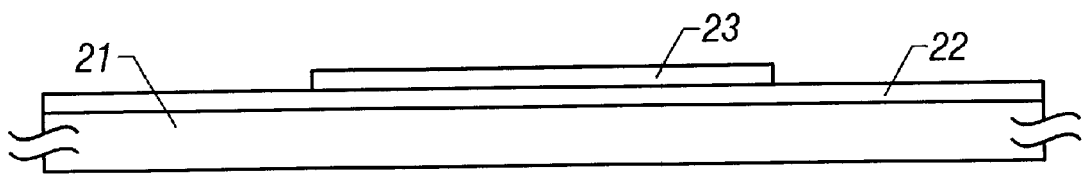
FIGS. 2A to 2D show a process of producing a TFT in accordance with another embodiment.

In FIG. 2A, a silicon oxide film having a thickness of 3000 Å is formed as an under film 22 on the glass substrate 21. Also, there is formed an island semiconductor layer 23 which is a crystalline silicon film forming the active layer of the TFT.

After the state of FIG. 2A, a silicon oxide film 24 forming a gate insulating film with a thickness of 1000 Å is formed on the surface by plasma CVD. A film mainly containing aluminum with a small amount of scandium therein is formed with a thickness of 5000 Å by sputtering or electronic beam vapor deposition. Thereafter, a gate electrode 25 which is made of a material that mainly contains aluminum is formed by patterning.

Figure 2B:
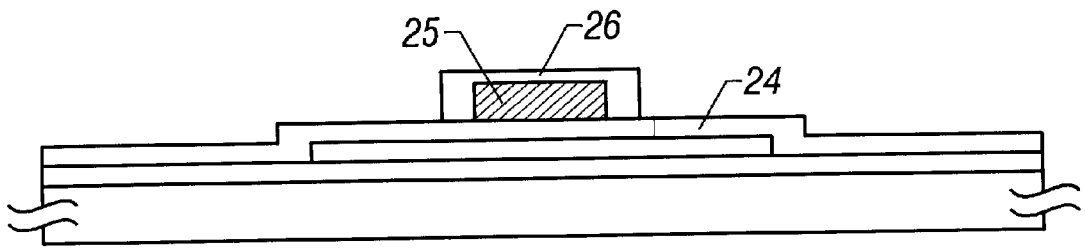

After the formation of the gate electrode 25, anodization is conducted with the gate electrode 25 as an anode in an electrolytic solution, to form an anodic oxide film 26 The thickness of the anodic oxide film 26 is 2500 Å. In this way, a state of FIG. 2B is obtained.

Figure 2C:
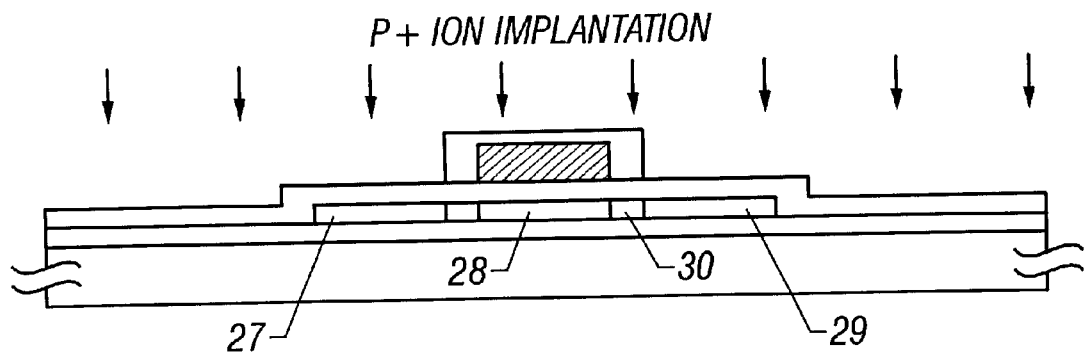

Then, in order to form a source region and a drain region in the active layer, P (phosphorus) ions is implanted by plasma doping as shown in FIG. 2C. In a p-channel TFT, B (boron) ions may be implanted. In this process, the P ions are implanted in regions 27 and 28 with the gate electrode 25 as a mask. Also, a channel forming region 28 is formed in a self-alignment. Offset gate regions 30 is formed with the anodic oxide film 26 as a mask. Then, a laser light is irradiated so that the regions 27 and 29 which have been made amorphous by the impulse of the implanted ions are crystallized and the P-ions are activated. Thus, the source region 27 and the drain region 29 are formed.

An infrared ray may be irradiated onto the surface so that the source region 27 and the drain region 29 are formed. Also, heating may be conducted. However, in the heating process, since heating at 500° C. or higher is required, silicon or a metal having high heat resistance is necessary to be used instead of aluminum as the material of the gate electrode 25.

Figure 2D:
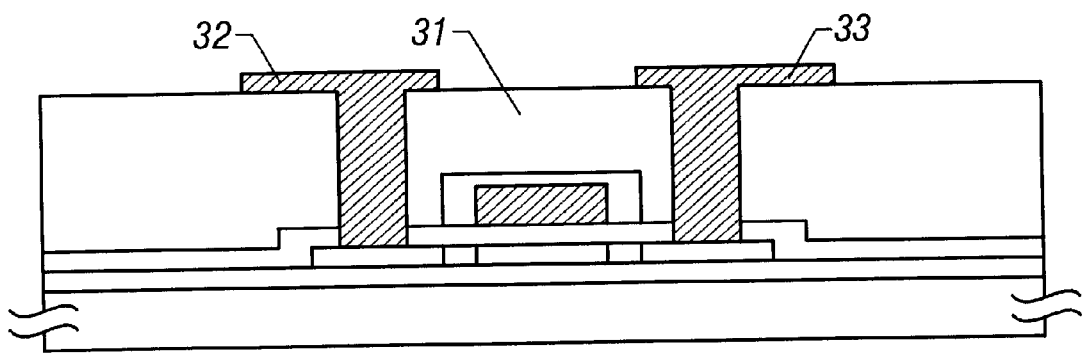

In FIG. 2D, a silicon oxide film 31 is formed as an interlayer insulating film by plasma CVD. Then, contact holes are formed, and a source electrode 32 and a drain electrode 33 are formed therein. These electrodes 32 and 33 are made up of a laminate film made of a titanium film and an aluminum film. The titanium film is formed by sputtering, and the aluminum film is formed by vapor deposition. Thus, an n-channel TFT is produced.

Figure 3:
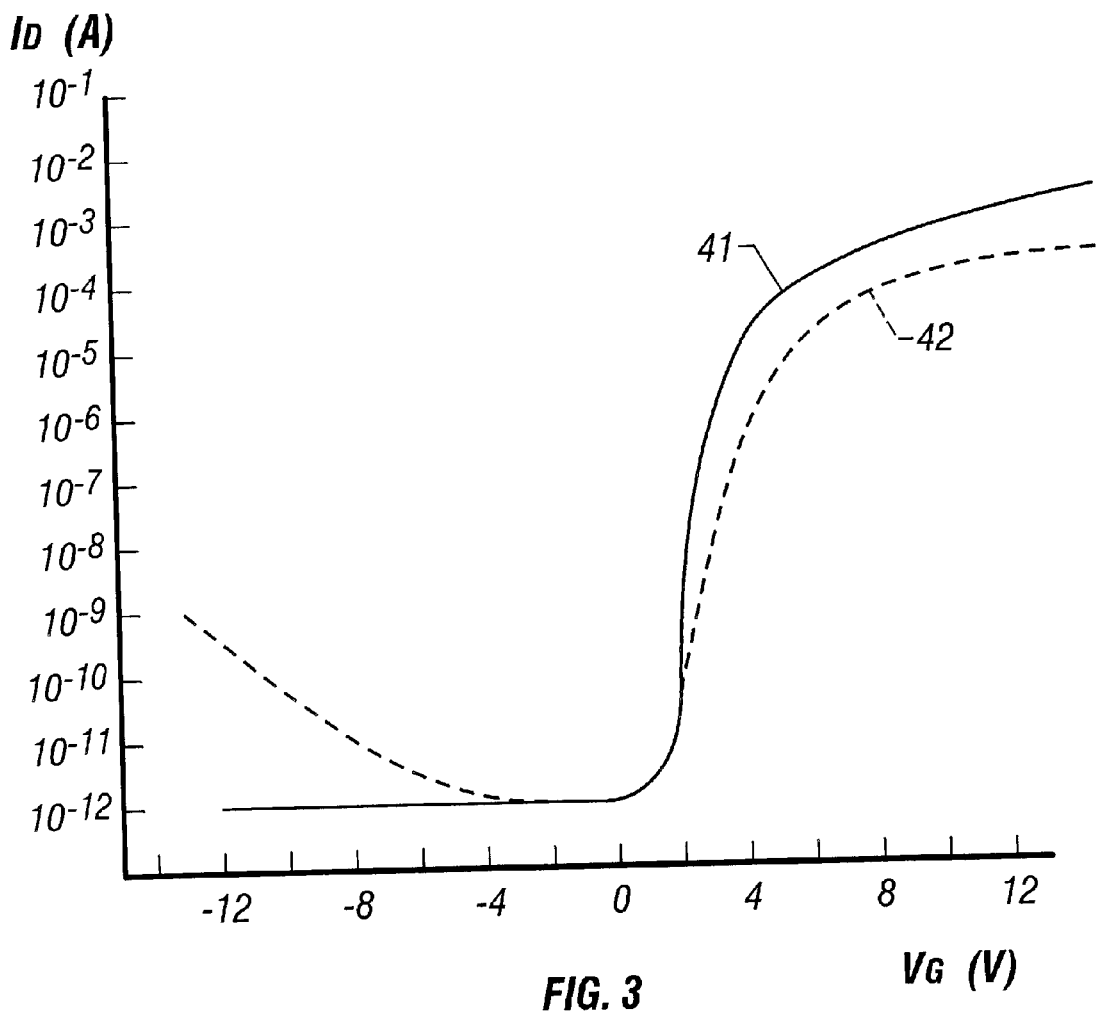
FIG. 3 is a graph representing an example of the characteristic of the TFT.

FIG. 3 shows a relationship between a gate voltage and a drain current of the TFT. Numeral 41 represents the characteristic of the TFT obtained by the embodiment. Numeral 42 represents the characteristic of the TFT in accordance with a comparative example.

The TFT of the comparative example is heated at 550° C. for 4 hours in a heating process for a crystalline silicon film constructing its active layer (this heating process is made in the process of FIG. 1C). Other conditions for the producing processes are the same as those shown in FIGS. 1A to 2D.

In FIG. 1C, when the heating process is performed at 550° C. for 4 hours, a stress in the glass substrate is not released, which leads to the strain or deformation of the glass substrate. However, in this example, this problem is ignored because of comparison. Hence, differences in the TFTs representing the characteristics 41 and 42 in FIG. 3 exist in the forming conditions (accurately its heat treatment conditions) of the crystalline silicon film constructing its active layer.

In FIG. 3, the characteristic 42 of the TFT has a high off current. This represents that a current that leaks at the off state is large. The characteristic 41 of the TFT is small in a current that leaks at the off state, that is, has an excellent characteristic.

It is supposed that the off current characteristic 42 of the TFT is lowered for the reasons stated below.

Observing the active layer of the TFT having the characteristic 42 by TEM (transmission electron microscopy), it has been found that the lumps of nickel elements exist at places. The lumps of the nickel elements are several tens to several hundred Å or more in size.

Observing the active layer of the TFT having the characteristic 41 by TEM, the lumps of the nickel elements have been hardly observed, and it has been confirmed that even though they have been observed, its size is several tens Å or less.

The off current in the TFT is directed to a current which is allowed to flow between the source and the drain in the off state of the TFT (a state in which a reverse bias is applied to the gate electrode).

The cause for allowing the off current to flow is, as disclosed in Japanese Patent Examined Publication No. 3-38755, because carriers are moved through a trap level in the vicinity of a boundary between the channel forming region and the drain region. Hence, it is supposed that the TFT having the characteristic 42 becomes large in its off current because there exists the trap level caused by the lumps of the nickel elements existing in the active layer (in particular, the trap level exists in the vicinity of the boundary between the channel forming region and the drain region).

The TFT having the characteristic 41 is little in the lumps of the nickel elements existing in the active layer and small in its size, and thus it is understandable that the existing density of the trap level is low and the off current accompanied by the low density is also low. Also, it is supposed that the reason why the lumps of the nickel elements existing in the active layer of the TFT having the characteristic 41 is less in number and its size is also small is that the nickel elements are dispersed and difficult to concentrate since the temperature of the heat treatment for crystallization is higher than in the case of the TFT having the characteristic 42.

Also, when an active layer is constructed using the crystalline silicon film formed at 700° C. as in the TFT having the characteristic 41, it is supposed that its crystal-linity higher than that of the crystalline silicon film formed by the heat treatment at about 550° C. is also caused by the difference in characteristic of FIG. 3. That is, when the crystallinity is low, the density of the trap level is high with the result that the off current becomes large. When the crystallinity is high, the density of the trap level is low with the result that the off current becomes small.

In the TFT obtained by this embodiment, its mobility can be set to be large. When the amorphous silicon film is thermally processed at 620° C. for 24 hours so as to be transformed into a crystalline silicon film, and an n-channel TFT is formed using the crystalline silicon film, its mobility is generally 20 to 50 $cm^2/Vsec$. The mobility of the TFT (its characteristic 42 is represented as one example) using the crystalline silicon film obtained by the heat treatment at 550° C. for 4 hours is 60 to 100 $cm^2/Vsec$. On the contrary, in the TFT obtained by the process according to the present invention, the mobility of 80 to 150 $cm^2/Vsec$ can be obtained. This is because the crystalline silicon film as used is excellent in crystallinity.

(Fifth Embodiment)

In a fifth embodiment, after the crystalline silicon film 107 shown in FIG. 1D is obtained by the process of the first embodiment, a laser beam is irradiated on the crystalline silicon film 107 so as to enhance its crystallinity. A crystalline silicon film 17 in FIG. 1D contains the amorphous silicon components therein although it is a little.

The amorphous silicon components can be allowed to disappear by another heat treatment. That is, with another heat treatment, the crystallinity can be enhanced more. However, this heat treatment requires several hours additionally, and thus is not preferable from the viewpoint of productivity.

Thus, in this embodiment, after the state of FIG. 1D, another laser light irradiation is conducted so that its crystallinity is improved. By the way, when the amorphous silicon film is irradiated with a laser light to obtain a crystalline silicon film, there arises such a problem that its reproducibility is low. However, in this embodiment, when a laser light is additionally irradiated onto a silicon film which has been crystallized once, its effect can be obtained with a high reproducibility.

The laser light is preferably an excimer laser beam having a wavelength of an ultraviolet region. In this example, the KrF excimer laser having 248 nm in wavelength is used. The density of an irradiation energy may be 300 to 400 $mJ/cm^2$.

As described in this embodiment, a laser light is irradiated onto the crystalline silicon film which has been crystallized once by heating, thereby enhancing its crystallinity. Then, its effect can be obtained with a high reproducibility.

(Sixth Embodiment)

Figure 4A:
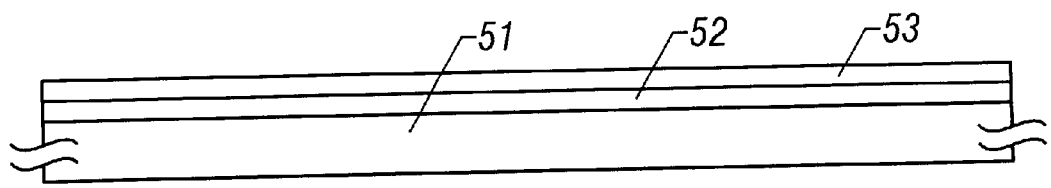
FIGS. 4A to 4D show a process of producing a crystalline silicon film in accordance with another embodiment.

FIGS. 4A to 4D show a process of producing a TFT according to a sixth embodiment. This embodiment is to form a crystalline silicon film on a quartz substrate. A silicon oxide film having a thickness of 3000 Å is formed as an under film 52 on a quartz substrate 51, so as to prevent the impurity from being diffused in the silicon film from the quartz substrate. Then, an amorphous silicon film 53 having a thickness of 500 Å is formed by low pressure thermal CVD. (FIG. 4A)

Figure 4B:
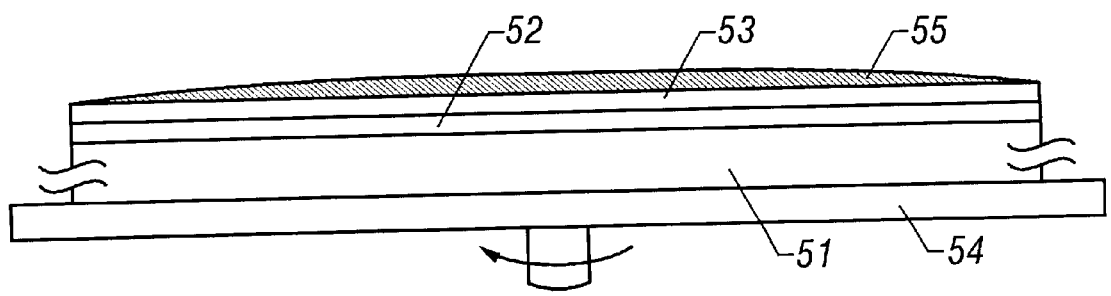

A nickel acetate solution having a desired concentration is applied on the surface of the amorphous silicon film, to form a water film 55 of the nickel acetate solution (FIG. 4B).

A spin coating is conducted using a spinner 54. At the same time, an excessive nickel acetate solution is blown off. The nickel elements are disposed in contact with the surface of the amorphous silicon film 53. The concentration of the nickel elements in the nickel acetate solution is adjusted so that the concentration of the nickel elements existing in the silicon film is finally about $1\times10^{15}$ to $5\times10^{19}$ atoms cm$^{-3}$ or less.

Figure 4C:
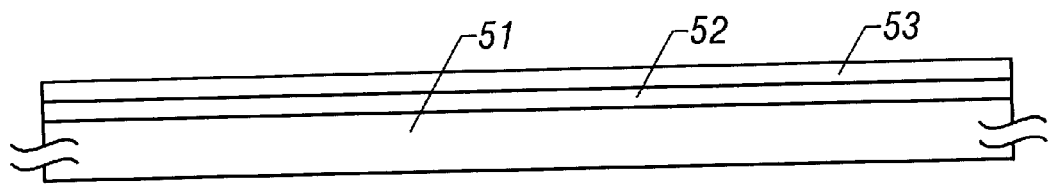
Figure 4D:
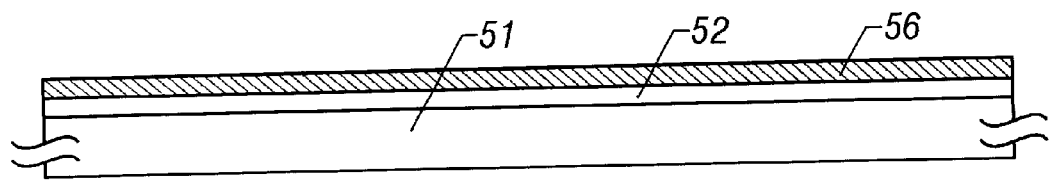

Thus, a state of FIG. 4C is obtained. In this state, the nickel elements are disposed in contact with the surface of the amorphous silicon film 53. Then, a heat treatment is conducted at 950° C. for 4 hours. After the heat treatment, cooling is conducted at a cooling rate of 0.5° C./min until 700° C. The reason why the cooling is conducted in this stage is that a stress in the silicon film is suppressed from remaining. By the heat treatment, the amorphous silicon film 53 can be transformed into a crystalline silicon film 56. (FIG. 4D)

It is important to set the temperature of the heat treatment conducted at this stage to be remarkably higher than the crystallization temperature of the amorphous silicon film 53. With such a high temperature, the crystalline silicon film can be obtained in a short time such as 4 hours, and its crystallinity can be made remarkably high. Also, the nickel elements for promoting crystallization can be dispersed in the film so that the trap level locally having a high density can be prevented from being formed. According to the experiment, it has been proved that the crystallization temperature of the amorphous silicon film shown in this embodiment is about 590° C.

With the heat treatment at a high temperature, a crystalline silicon film having a very high crystallinity can be obtained. In general, there has been known a technique in which the amorphous silicon film formed on the quartz substrate is crystallized by heating at about 900° C. The crystalline silicon film 56 obtained in this embodiment has a higher crystallinity than that of the crystalline silicon film obtained by the technique using the known quartz substrate. This is an effect obtained by using the metal elements that promote the crystallization of silicon.

(Seventh Embodiment)

In a seventh embodiment, a copper element is used instead of a nickel element in the process of the sixth embodiment. The copper elements are disposed in contact with the surface of the amorphous silicon film, using copper (II) acetate $(Cu(CH_3COO)_2)$. The heat treatment as in the sixth embodiment is conducted to obtain the crystalline silicon film. The concentration of the copper elements in the solution may be the same as in the case of the nickel elements used in the sixth embodiment.

(Eighth Embodiment)

An eighth embodiment shows an example of producing an n-channel TFT according to the present invention. A crystalline silicon film is formed on a glass substrate in accordance with the process described in the sixth embodiment and then patterned to obtain a state of FIG. 5A.

Figure 5A:
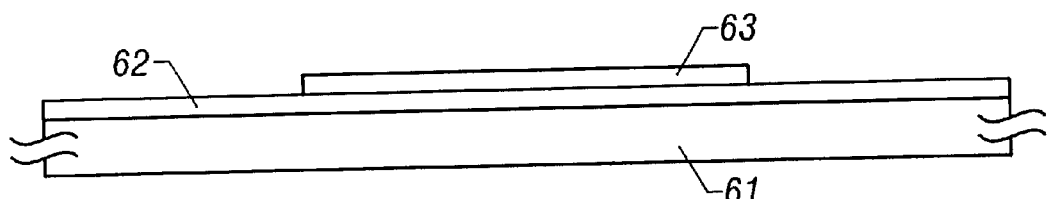
FIGS. 5A to 5D show a process of producing a TFT in accordance with another embodiment.

In FIG. 5A, a silicon oxide film having a thickness of 3000 Å is formed on a quartz substrate 61 as an under film 62, and an island-like semiconductor layer 63 made of a crystalline silicon film forming the active layer of the TFT is formed thereon.

Figure 5B:
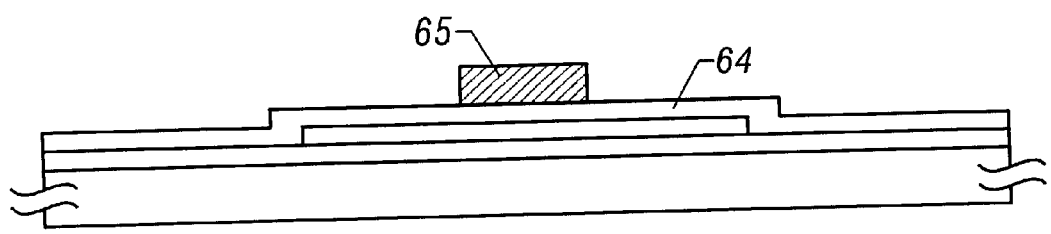

After the state of FIG. 5A, a silicon oxide film 64 having a thickness of 1000 Å, which forms a gate insulating film is formed by plasma CVD. Then, the n-type microcrystalline silicon film containing P (phosphorus) therein is formed by low pressure thermal CVD and then is patterned to form a gate electrode 65. In this way, a state of FIG. 5B is obtained. The gate electrode 65 is made of silicon. Instead, a metal material having high heat resistance or its silicide may be used. A multilayer structure having a metal and a semiconductor may be used.

Figure 5C:
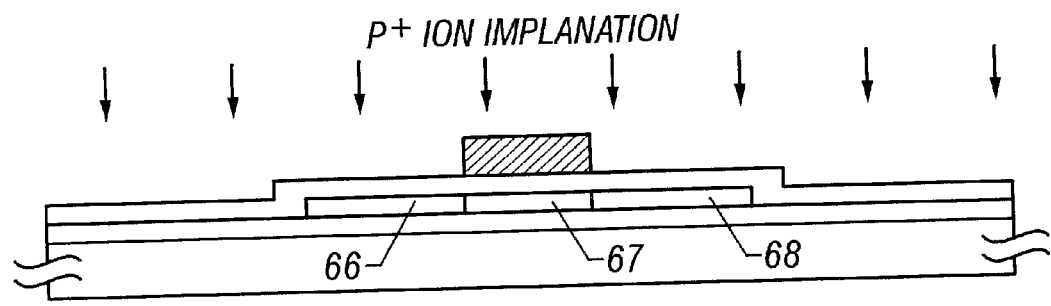

In order to form the source region and the drain region in the active layer 63, P (phosphorus) ions are implanted as shown in FIG. 5C. If a p-channel TFT is to be obtained, B (boron) ions may be implanted. In this example, the P ions are implanted into the regions 66 and 68 by plasma doping using the gate electrode as a mask. Also, a channel formation region 67 is formed in a self-alignment. Then, a heat treatment is conducted at 950° C. for 2 hours so that the regions 66 and 68 which have been made amorphous by the impulse of the implanted ions are crystallized and the implanted P-ions are activated.

Instead of that heat treatment, a laser beam may be irradiated. Also, a laser beam may be irradiated while heating at 800 to 1100° C. Instead of the laser beam irradiation, an intense light (for example, an infrared ray) may be irradiated.

Figure 5D:
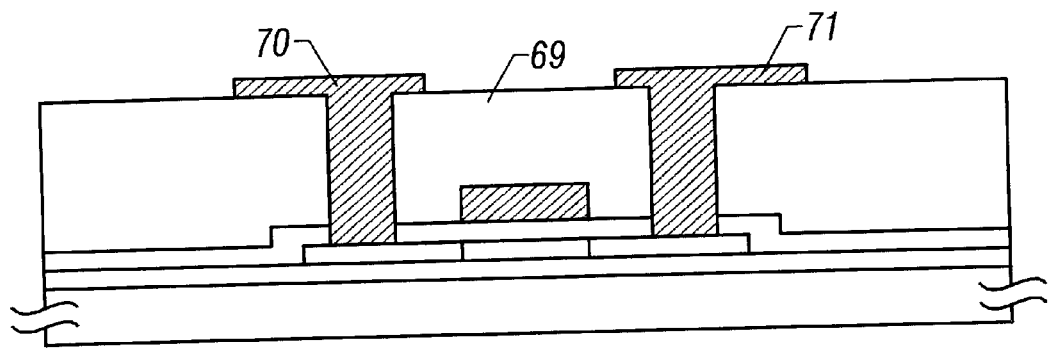

In FIG. 5D, a silicon oxide film 69 is formed as an interlayer insulating film by plasma CVD. Contact holes are formed, and then a source electrode 70 and a drain electrode 71 are formed. Those electrodes are made of titanium. In this way, an n-channel TFT is produced.

The TFT produced by the present invention is large in mobility and small in off current characteristic in comparison with the TFT using the crystalline silicon film formed on the glass substrate at about 600° C. The reason why the mobility is large is because the mobility of carriers becomes high by obtaining a high crystallinity. Also, the reason why the off current characteristic is small is because the number of carriers that move via the trap level is reduced by making the density of the trap level small.

The off current in the TFT is directed to a current which is allowed to flow between the source and the drain in the off state of the TFT (in a state where a reverse bias is applied to a gate electrode).

The cause for the off current is, as disclosed in Japanese Patent Examined Publication No. 3-38755, because carriers are moved through a trap level in the vicinity of a boundary between the channel forming region and the drain region. Thus, the crystallinity of the crystalline silicon film forming the active layer is increased, and the trap level density is lowered, so that the value of the off current can be reduced.

(Comparative Example)

The producing process in a comparative example described here is an example in which, in the process of the sixth embodiment, a glass substrate is used as a substrate, a heat treatment for crystallization is conducted at 550° C., to obtain a crystalline silicon film, and a TFT is produced using the crystalline silicon film.

The producing process of this comparative example is described with reference to FIGS. 4 and 5. The glass substrate is used as the substrate 51. The silicon oxide film 52 having a thickness of 3000 Å is formed on the glass substrate 51 as an under film. The amorphous silicon film 53 having a thickness of 500 Å is formed by low pressure thermal CVD. Thus, a state of FIG. 4A is obtained.

A nickel acetate solution is applied on the surface of the amorphous silicon film 53 under the same conditions as those of the sixth embodiment, and then spin-coated by a spinner 54. (FIG. 4B)

Thus, a state of FIG. 4C is obtained. The nickel elements are disposed in contact with the surface of the amorphous silicon film 53.

In FIG. 4C, a heat treatment is conducted at 550° C. for 4 hours. In this process, a crystalline silicon film 106 can be obtained by the action of the nickel elements. (FIG. 4D)

Then, the crystalline silicon film is patterned to form the active layer of the TFT. This state is shown in FIG. 5A. In FIG. 5A, numeral 61 is a glass substrate, 62 is a silicon oxide film of the under film, and 63 is the active layer of the TFT.

After the gate insulating film 64 is formed, an n-type crystalline silicon film is formed and patterned to form a gate electrode 65. Thus, a state of FIG. 5B is obtained.

Then, P (phosphorus) ions is implanted by plasma doping so that a source region 66, a drain region 68 and a channel forming region 67 are formed in a self-alignment. Further, a laser beam is irradiated to recrystallize and activate the source region 66 and the drain region 68. (FIG. 5C)

An interlayer insulating film 69 is formed by plasma CVD, and after the contact holes is formed, a source electrode 70 and a drain electrode 71 are formed to form a TFT.

The mobility of the TFT according to this comparative example is about 60 to 70% of the TFT of the sixth embodiment. However, the off current characteristic is degraded in comparison with that of the TFT of the sixth embodiment. In order to improve the off current characteristic, a specific structure such as an offset gate structure or an LDD (lightly doped drain) structure is required.

Also, the TFT according to this comparative example has such a problem that the dispersion of the characteristic for each element is remarkably large. It is supposed that this is caused for the following reasons. Observing the active layer of the TFT according to this embodiment by TEM (transmission electron microscope), it has been confirmed that the metal elements are locally concentrated in the active layer. As is well known, if the metal elements are locally concentrated in the semiconductor, the trap level having a high density is formed. The existence of the trap level having such a high density leads to the deterioration of the device or the instability of the operation. Thus, the TFT of this embodiment has a large dispersion in the characteristics between each element.

On the contrary, the TFT produced by the sixth embodiment has a characteristic that the dispersion for each element is very small. Also, observing the active layer of the TFT produced in the process of the sixth embodiment by TEM, the nickel elements are hardly locally concentrated in the active layer. This supports that the dispersion for each element is small. It is supposed that the reason why the local concentration of the nickel elements is hardly found is because the nickel elements are dispersed in the silicon film by heating at 950° C.

(Ninth Embodiment)

In a ninth embodiment, the crystalline silicon film 56 in FIG. 4D is obtained by the process of the sixth embodiment, and a laser light is additionally irradiated onto the crystalline silicon film 56 to increase its crystallinity. The crystalline silicon film 56 contains a little amorphous component.

The amorphous component can be allowed to disappear by a heat treatment. That is, the heat treatment is additionally conducted, thereby to more increase the crystallinity. However, the heat treatment further requires several hours, and thus is not of a preferable step from the viewpoint of the productivity.

Thus, this embodiment is characterized in that, in the process of the sixth embodiment, after the state of FIG. 4D is obtained, a laser light is further irradiated, to increase the crystallinity of the crystalline silicon film 56.

The laser light irradiated is preferably an excimer laser beam having a wavelength of an ultraviolet region. In this embodiment, a KrF excimer laser having 248 nm in wavelength is used. Also, the irradiation energy density is 300 to 400 mJ/cm$^2$.

As described in this embodiment, a laser beam is irradiated onto the crystalline silicon film which has been crystallized once by heating, thereby to increase its crystallinity. Then, its effect can be obtained with a high reproducibility.

In this embodiment, a laser beam is used. Instead, an intense light such as infrared rays may be irradiated.

(Tenth Embodiment)

A tenth embodiment relates to an active matrix liquid crystal display unit having a structure in which a peripheral circuit is also integrated on a single quartz substrate. A producing process for the active matrix circuit is described according to this embodiment with reference to FIGS. 6A to 6E.

FIGS. 6A to 6E show at its left side a peripheral logic circuit TFT (peripheral circuit TFT), and at its right side an active matrix circuit TFT (pixel TFT), respectively.

A silicon oxide film having a thickness of 1000 to 3000 Å is formed on a quartz substrate 81 as an under oxide film 82. The silicon oxide film may be formed by sputtering or plasma CVD in an oxygen atmosphere.

Then, an amorphous silicon film having a thickness of 500 Å is formed by plasma CVD or low pressure thermal CVD. Further, a metal element such as nickel that promotes the crystallization of silicon is disposed in contact with the surface of the amorphous silicon film by the same method as that described in the sixth embodiment.

A heat treatment at 900° C. for 4 hours is conducted so that the amorphous silicon film is transformed into a crystalline silicon film. After the heat treatment, a laser beam or an intense light may be irradiated onto the crystalline silicon film, to thereby further increase the crystallinity.

Then, the crystalline thus obtained is etched to form active layers 83 (for a p-channel TFT) and 84 (for an n-channel TFT) of a TFT of an island-like peripheral drive circuit (a peripheral circuit TFT), and an active layer 85 of a TFT of a matrix circuit (a pixel TFT).

Further, a gate insulating film 86 formed of a silicon oxide film having 500 to 2000 Å in thickness is formed by sputtering in the oxygen atmosphere. The method of forming the gate insulating film 86 may be performed by plasma CVD. When the silicon oxide film is formed by plasma CVD, dinitrogen monoxide ($N_2O$) or oxygen ($O_2$) and monosilane ($SiH_4$) are preferably used.

Figure 6A:
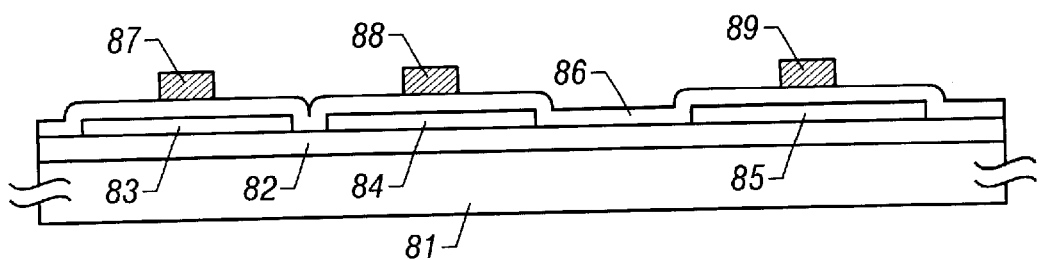
FIGS. 6A to 6E show a process of producing a TFT in accordance with another embodiment.

A polycrystal silicon film having 2000 Å to 5 μm, preferably 2000 to 6000 Å in thickness (containing P (phosphorus) for increasing the conductivity) is formed on the entire surface of the substrate by low pressure thermal CVD and then etched to form gate electrodes 87, 88 and 89. (FIG. 6A)

Figure 6B:
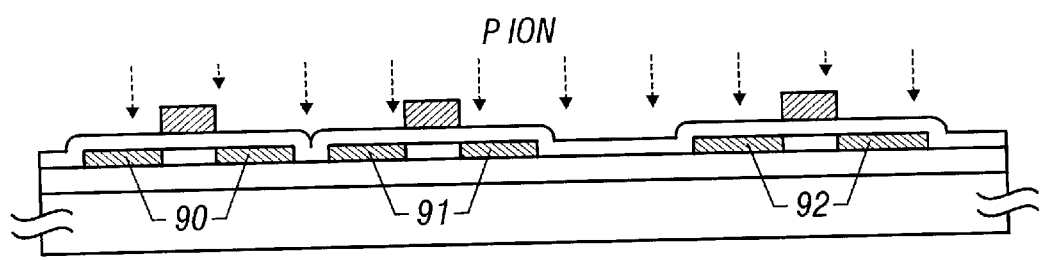

Then, P (phosphorus) is implanted into all the island-like active layers 83 to 85 using the gate electrodes 87 to 89 as masks in the self-alignment, using phosphorus ($PH_3$) as a doping gas. The dose is $1\times10^{12}$ to $5\times10^{13}$ atoms/cm$^2$ with the result that weak n-type regions 90, 91 and 92 are formed (FIG. 6B).

A mask 98 of photoresist is formed to cover the active layer 83 of the p-channel TFT. Simultaneously, a mask 94 of photoresist is formed to cover a portion that extends in parallel to the gate electrode 89 from an end of the gate electrode 89 to a portion apart from the end by 3 μm, of the active layer 85 of the pixel TFT.

Figure 6C:
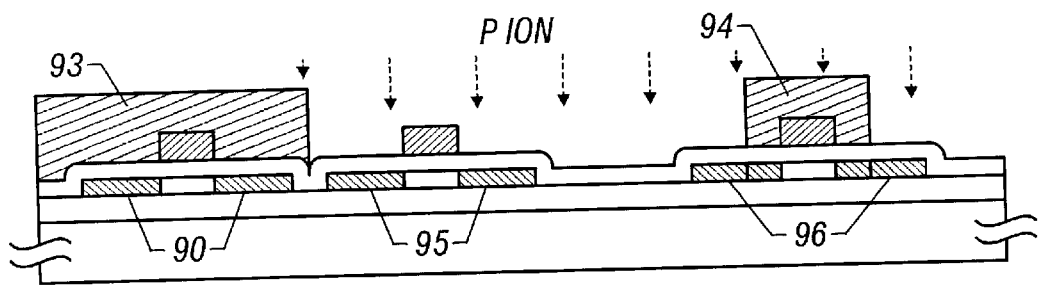

Then, P (phosphorus) ions are again implanted into the surface with phosphorus as a doping gas by ion doping. At this time, P (phosphorus) is not implanted into the portions under the resist masks 93 and 94. Thus, strong n-type regions (source/drain regions) 95 and 96 are formed. In this process, among the weak n-type region 92 of the active layer 85 of the pixel TFT, a region 97 (FIG. 6D) covered with the mask 94 is disposed in the weak n-type state without P (phosphorus) being implanted. (FIG. 6C)

The active layers 84 and 85 of the n-channel TFT are covered with the mask 98 of photoresist, and B (boron) ions are implanted into the island-like region 83 by ion doping with diborane ($B_2H_6$) as a doping gas. The dose is $5 \times 10^{14}$ to $8 \times 10^{15}$ atoms/cm$^2$. In the doping, since the dose of B ion exceeds the dose of P ion in FIG. 6C, the weak n-type region 90 which has been formed in advance is reversed to a strong p-type region 99.

Figure 6D:
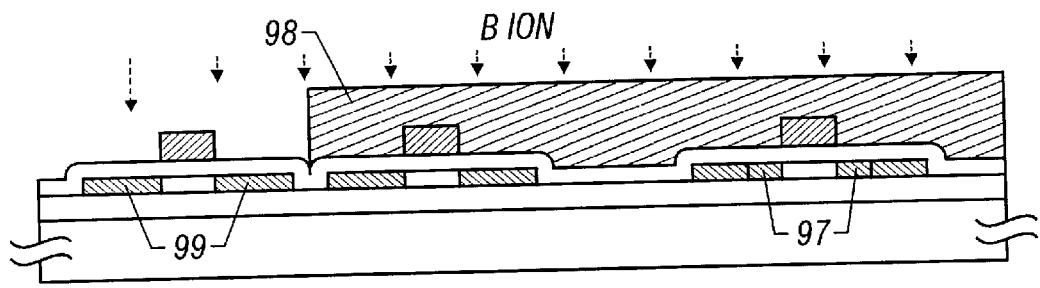

By the above doping, the strong n-type regions (source/drain) 95 and 96, the strong p-type region (source/drain) 99 and the weak n-type region (low concentration impurity region) 97 are formed. The width x of the low concentration impurity region 97 becomes about 3 μm with the size of the photoresist mask 94. The drain region side of the low concentration impurity region 97 functions as an LDD region. (FIG. 6D)

Then, a heat treatment at 900° C. for 2 hours is conducted so that any damage caused by doping is restored. Simultaneously, the doping impurity is activated. Then, a silicon oxide film having 5000 Å in thickness is formed on the entire surface as an interlayer insulator 100 by plasma CVD. This may be of a multilayer film made up of a silicon nitride film or a silicon oxide film and a silicon nitride film. Then, the interlayer insulator 100 is etched by wet etching to form contact holes for source/drain regions.

Figure 6E:
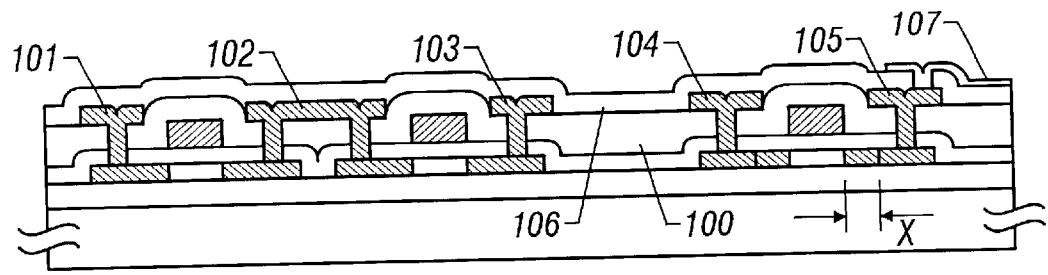

A titanium film having 4000 Å in thickness is formed by sputtering and then etched to form electrode-wirings 101, 102 and 103 of the peripheral circuit. Simultaneously, the electrode-wirings 104 and 105 of the pixel TFT are formed. Further, a silicon nitride film 106 having a thickness of 2000 Å is formed as a passivation film by plasma CVD and then etched to form a contact hole that reach the electrode 105 of the pixel TFT. Finally, an ITO (indium tin oxide) having 1500 Å in thickness which has been formed by sputtering is etched to form a pixel electrode 107. Thus, the peripheral circuit and the active matrix circuit can be integrally formed. (FIG. 6E)

(Eleventh Embodiment)

An eleventh embodiment is characterized in that the amorphous silicon film 53 is replaced by a microcrystal silicon film in the process of the sixth embodiment. For forming the microcrystal silicon film, low pressure thermal CVD using disilane as a raw gas may be used. In this embodiment, the amorphous silicon film is not transported into the crystalline silicon film by the heat treatment, but the crystallinity of the microcrystal silicon film is promoted by the heat treatment to obtain a crystalline silicon film with a higher crystallinity.

(Twelfth Embodiment)

A twelfth embodiment relates to an n-channel TFT having high practicability, which realizes the low off current characteristic by an offset gate region. FIGS. 7A to 7E show an outline process of producing a TFT according to this embodiment.

A silicon oxide film 112 having a thickness of 5000 Å is formed on a quartz glass substrate 111 as an under film. The silicon oxide film functions to release a stress generated between the quartz substrate and the silicon film to be formed thereon. Its thickness is preferably at least 3000 Å or more.

Figure 7A:
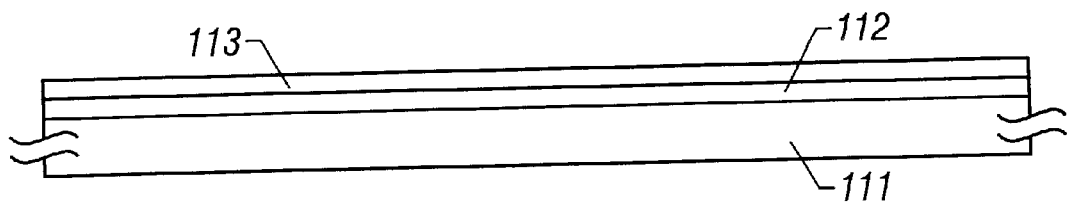
FIGS. 7A to 7E show a process of producing a TFT in accordance with another embodiment.

An amorphous silicon film 113 which becomes a starting film of the silicon film constructing the active layer of the TFT is formed on the silicon oxide film 112 by low pressure thermal CVD. In this example, disilane is used as a film forming gas, and the amorphous silicon film 113 having a thickness of 1000 Å is formed. In this embodiment, in order to control a value of $V_{th}$ of the TFT obtained, a little amount of diborane is contained in disilane. (FIG. 7A)

After the formation of the amorphous silicon film 113, nickel acetate solution is applied on the amorphous silicon film 113 by spin coating. This process realizes a state in which the nickel elements are disposed in contact with the surface of the amorphous silicon film 113.

Then, a heat treatment at 800° C. for 4 hours is conducted to crystallize the amorphous silicon film 113. After the heat treatment, cooling is conducted at 2° C./min or less, to release a stress in the silicon film.

It is effective to conduct the heat treatment at a higher temperature, however it is preferable to conduct the heat treatment at about 800 to 900° C., from the viewpoint of giving a cooling time or a load to an apparatus (device).

Figure 7B:
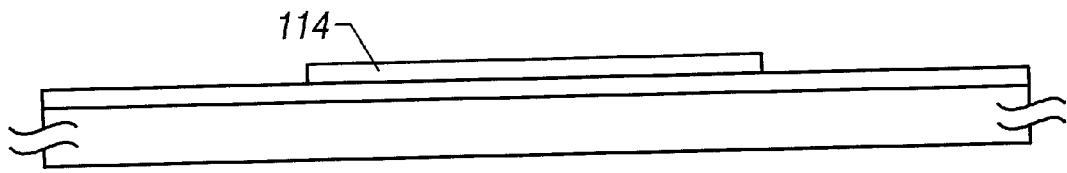

The amorphous silicon film which has been crystallized is patterned to form the active layer 114 of the TFT (FIG. 7B).

Figure 7C:
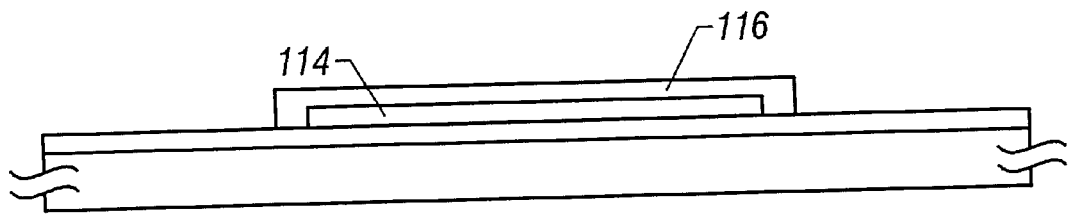

Further, a silicon oxide film 116 having a thickness of 500 Å is formed using thermal oxidation. The heating temperature is 950° C. The thickness of the active layer 114 is about 750 Å by forming the silicon oxide film 116 having a thickness of 500 Å by thermal oxidation. (FIG. 7C)

Figure 7D:
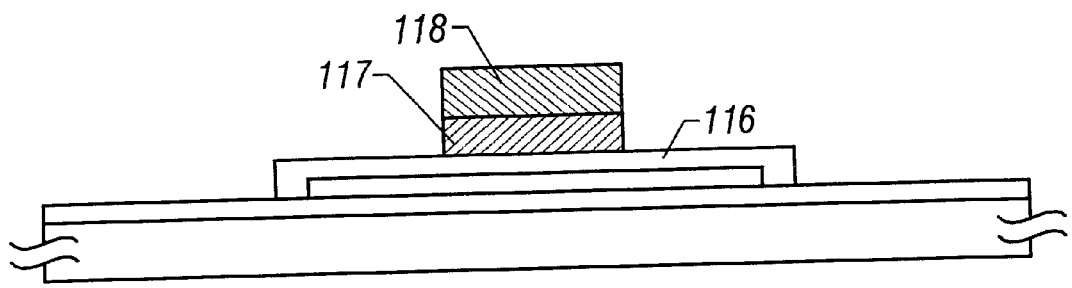

Then, a molybdenum silicide having a thickness of 5000 Å constructing a gate electrode is formed. A material constructing the gate electrode preferably has a resistance as low as possible. A tungsten silicide may be used other than molybdenum silicide. A resist mask 118 is formed, and a film having 5000 Å in thickness which is made of the molybdenum silicide is patterned to form a region 117 as a gate electrode. (FIG. 7D)

Figure 7E:
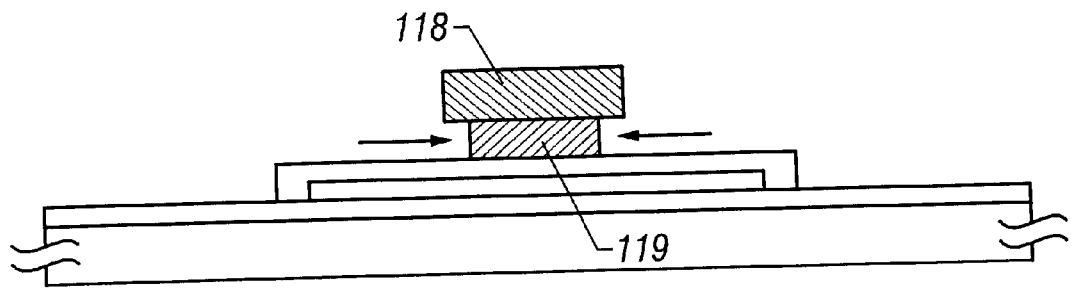

An anisotropic etching by which the molybdenum silicide can be selectively etched is performed. Etching is progressed in a direction of an arrow in FIG. 7E, so that the size of the region 117 forming the gate electrode made of molybdenum silicide is reduced. An etching width is 5000 Å. Thus, a gate electrode 119 is formed. (FIG. 7E)

Figure 8A:
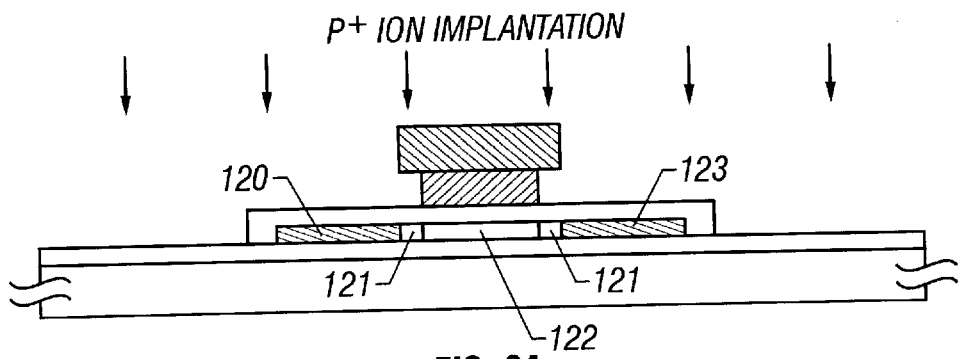
FIGS. 8A and 8B show a process of producing a TFT in accordance with another embodiment.

In that state, P (phosphorus) ions are implanted into regions 120 and 123 using plasma doping as shown in FIG. 8A. The regions 120 and 123 are the source region and the drain region. A region of the active layer immediately under the gate electrode 119 is a channel forming region 122. A region 121 into which P ions have not been implanted is an offset gate region. The width of the offset gate region 121 is 5000 Å. (FIG. 8A)

After the implantation of P ion in FIG. 8A, a heat treatment at 800° C. for 2 hours is conducted. Thus, the activation of the source/drain regions 120 and 123 and the annealing of damage caused by the ion implantation are performed.

A silicon oxide film 124 having a thickness of 6000 Å is formed as an interlayer insulating film by plasma CVD. After the formation of contact holes, a layer formed of a laminate containing a titanium film and an aluminum film is formed and then patterned to form a source electrode 125 and a drain electrode 126. Aluminum contains scandium at 0.2 weight % therein for preventing the generation of hillock. Further, although being not shown, an electrode which is in contact with the gate electrode 119 is formed. Also, a hydrogen thermal processing is conducted in the hydrogen atmosphere at 400° C. so that an dangling bond in the active layer is neutralized. Thus, the TFT shown in FIG. 8B is produced.

Figure 8B:
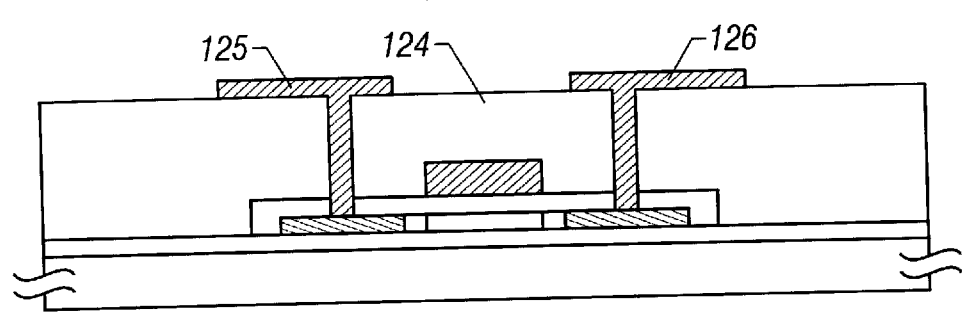
Figure 9:
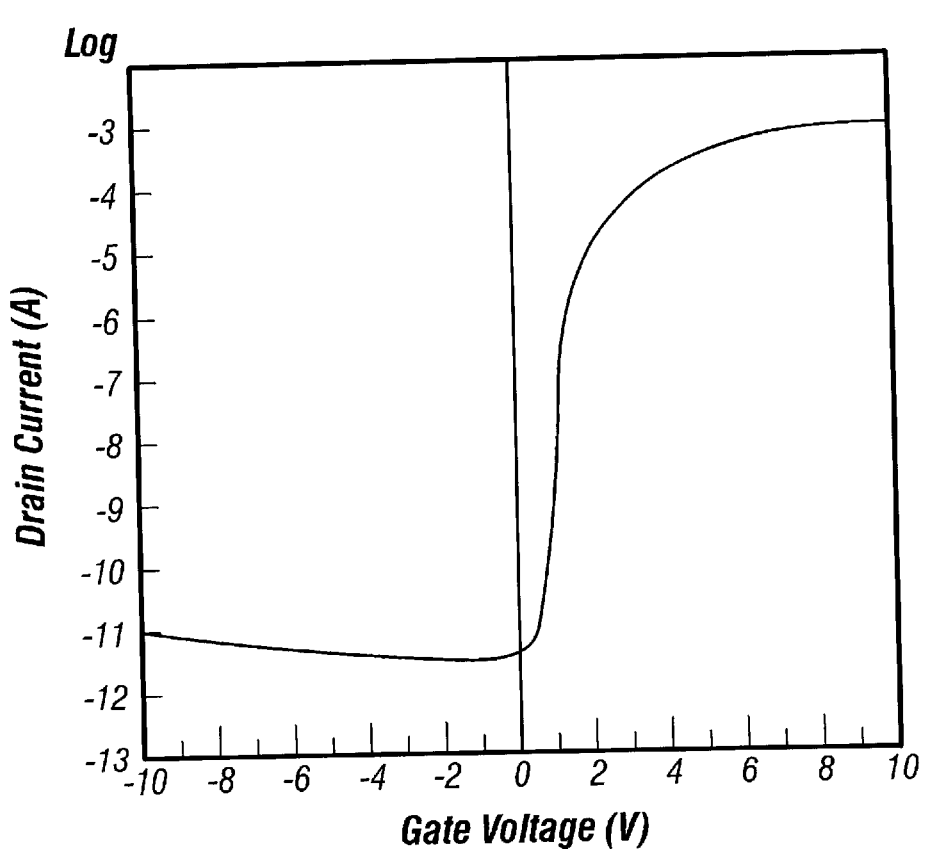
FIG. 9 is a graph representing an example of the characteristic of the TFT.

FIG. 9 shows an example of the characteristic of the TFT having a cross section shown in FIG. 8B (the characteristic has a dispersion not a little).

The TFT having the characteristic of FIG. 9 is 247.57 cm$^2$/Vs in mobility, 0.11 V in V$_{th}$, and 0.09 V/Dec in S value. The dispersion of the characteristic of the TFT obtained is within about 180 to 250 cm$^2$/Vs in mobility and within about 0.09 to 0.12 V/Dec in S value. The TFT having the above characteristic can conduct a high speed operation of several tens MHz. Hence, with suppressing that dispersion, an integrated circuit which processes an image signal can be formed on a quartz substrate.

FIG. 10 shows a table showing the producing methods and the characteristics for the TFTs produced by this embodiment and comparative examples together. Comparative examples 1 and 2 shown in FIG. 10 are basically produced by the producing process of FIGS. 7A to 7E and 8A and 8B.

The comparative example 1 is characterized in that a crystalline silicon film is obtained without using a metal element that promotes the crystallization of silicon. The comparative example 1 corresponds to a general TFT which is called a high temperature polysilicon TFT. Comparing this embodiment with the comparative example 1, an effect obtained by using the metal element can be confirmed.

The comparative example 2 is characterized in that a metal element that promotes the crystallization of silicon is used, and a heat treatment for crystallization of the amorphous silicon film 113, which is conducted in the process of FIG. 7A, is conducted at 550° C. and 4 hours. Comparing this embodiment with the comparative example 2, an influence of the difference of a heating temperature for crystallization of the amorphous silicon film 113 on the characteristic of the TFT can be confirmed.

In the comparative example 2, heating is not performed, but a laser beam is irradiated to activate of the source/drain regions 120 and 123.

In FIG. 10, with the producing process according to this embodiment, the TFT having a remarkable significant characteristic can be obtained in comparison with a case wherein nickel is not used as in the comparative example 1, as well as a case wherein nickel is used but a temperature of heating for crystallization is lowered to 550° C. as in the comparative example 2. The TFT shown in the comparative examples 1 and 2 cannot operate without a range of several MHz. That is, it cannot operate at a speed higher than about 1/10 of the operating speed of the TFT of this embodiment.

(Thirteenth Embodiment)

A thirteenth embodiment is that the process of producing the TFT shown in FIGS. 7A to 7E is partially changed. In FIG. 7A, in when after an amorphous silicon film is formed, it is crystallized using nickel, a crystalline silicon film in which a lot of crystal grains each apparently having a diameter of several hundred μm are formed is obtained.

Using the crystalline silicon film, a TFT having a remarkably high characteristic as described in the twelfth embodiment can be obtained. However, when a large number of TFTs are formed using a crystalline silicon film formed on a quartz substrate, such a situation that grain boundaries are positioned in an active layer at a given rate is realized.

On the grain boundaries, metal elements that promote crystallization and impurities are precipitated. The existence of such metal elements and impurities becomes a factor that impede the movement of carriers. Hence, when the grain boundary exists in the active layer, in particular, a channel forming region, the characteristic of the TFT obtained becomes low. This leads to the dispersion of the characteristic of the TFT.

The above problem is solved by not allowing the grain boundary to exist within the active layer. The size of the active layer is about 10 μm square at the smallest and about 100 μm square at the largest. As described above, the size of the grain boundary obtained is several hundred μm (the size of about 30 μm can be obtained according to the experiment).

In the process of this embodiment, the active layer formed of an amorphous silicon film is obtained by patterning the amorphous silicon film, and crystallization is then conducted using the nickel elements. In other words, after a state of FIG. 7B, the nickel elements are introduced, and thereafter a heat treatment at 800° C. for 4 hours is conducted to crystallize the amorphous silicon film having the shape of an active layer.

Since the size of the active layer is about 100 μm at the largest, the island-like amorphous silicon film patterned to the extend that size becomes substantially one crystal grain.

With such a structure, the grain boundary can be suppressed from existing in the active layer. Then, the dispersion of the characteristic of the TFT obtained can be decreased. In other words, the TFT having the remarkably high characteristics such that the mobility in the twelfth embodiment is approximately 250 cm$^2$/Vs, and S value is lower than 0.1 V/Dec can be obtained with suppressing the dispersion of the characteristic.

(Fourteenth Embodiment)

A fourteenth embodiment relates to a structure in which an influence of the metal elements that promote the crystallization of silicon is suppressed in the structure described in the thirteenth embodiment. As described in the thirteenth embodiment, when an amorphous silicon film which is a starting film is patterned into the shape of the active layer, and then the active layer having a crystal state is obtained by a heat treatment using nickel, there arises a problem stated below.

When crystallization is conducted after a pattern of the active layer formed of an amorphous silicon film is formed, the metal elements that promote the crystallization partially exist in the peripheral portion of the pattern of the active layer, that is, the edge of the pattern. The partial existence of the metal elements is a factor that permits a trap level to be formed at the side surface of the active layer or the edge portion. This may adversely affect the operation of the TFT.

Figure 11A:
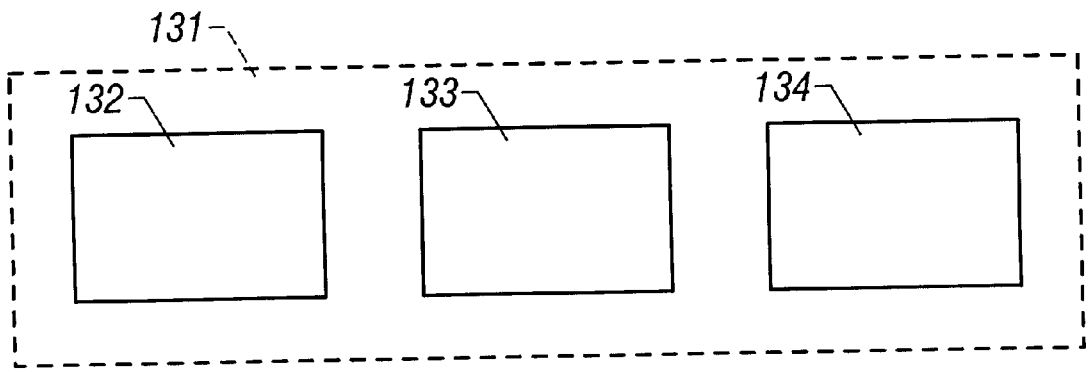
FIGS. 11A to 11C show a producing process in accordance with another embodiment.
Figure 11B:
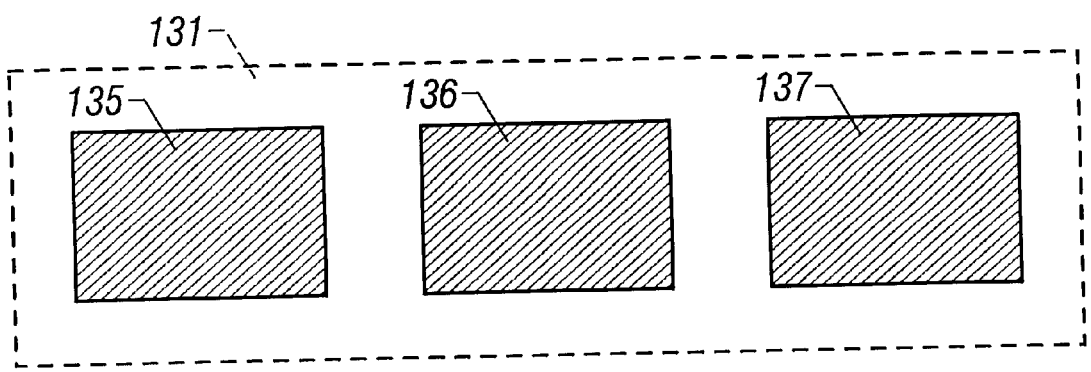
Figure 11C:
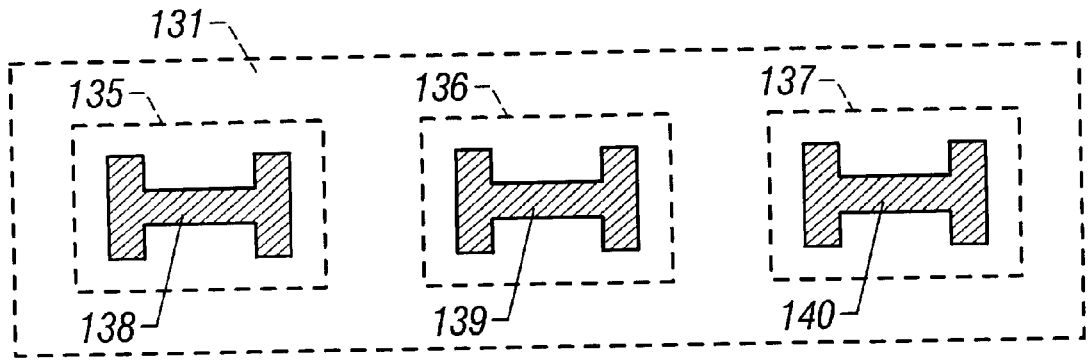

This embodiment is to provide a technique by which an active layer where there is no region in which the metal elements partially exist is obtained. FIGS. 11A to 11C show a process of producing an active layer according to this embodiment.

In FIG. 11A, numeral 131 is a specified region of an amorphous silicon film formed on a quartz substrate through an under silicon oxide film. Three rectangular patterns 132 to 134 are formed in this region. That is, there are formed three island regions 132 to 134 formed of amorphous silicon films.

The size of those patterns is 10 to 200 μm square, preferably 20 to 100 μm square. That is, the size of the patterns is set to be about 70% or less of the area of a crystal grain. The shape of the patterns may be of a square, a rectangle, a polygon, a circle or a semicircle. It may be of an arbitrary shape which is easy to use. A complicate shape is not preferred because it impedes the progress of crystallization.

The size of the patterns is preferably about 200 μm or less when it is converted into a circular shape. This is because the size of a crystal grain formed by the crystallization due to heating using nickel becomes 200 to 300 μm.

After the patterns 132 to 134 of the amorphous silicon film shown in FIG. 11A is formed, a nickel acetate solution is applied on those patterns 132 to 134 by spin coating, so that the nickel elements are disposed in contact with the surface from which the patterns 132 to 134 of the amorphous silicon films formed in a rectangle are exposed.

The concentration of the nickel elements in the nickel acetate solution is necessarily adjusted so that the concentration of nickel which finally remains in the film is $1 \times 10^{15}$ to $5 \times 10^{19}$ cm$^{-3}$. This is because the semiconductor characteristic is suppressed by an influence of the nickel elements if the concentration is more than the above range. This is also because the promotion action for the crystallization of the nickel elements is not obtained if the concentration is less than the above range. Similarly when the metal element other than nickel is used, the above concentration range can be used as a standard.

After the nickel acetate solution is applied, a heat treatment at 800° C. for 4 hours is conducted to crystallize the patterns 132 to 134 of FIG. 11A. As a result, there can be obtained rectangular patterns 135 to 137 having a crystalline property in FIG. 11B. Those patterns 135 to 137 are made up of a substantially single crystal grain.

The nickel elements partially exist in the edges of the patterns 135 to 137. Thus, the patterns 135 to 137 are further patterned. Then, patterns 138 to 140 of the active layers of the TFTs are formed. (FIG. 11C)

The patterns 138 to 140 can be made up of a substantially single crystal grain. Also, since a portion where the nickel elements partially exist is removed, resulting in a state where no nickel element partially exists in the active layer.

This embodiment shows the structure in which one pattern of the active layer of the TFT is obtained from one rectangular pattern. However, two or more patterns of the active layers may be obtained therefrom. Thus, the active layer can be obtained in the state where the influence of a grain boundary or a metal element that promotes crystallization is suppressed.

(Fifteenth Embodiment)

A fifteenth embodiment shows a technique in which a crystalline silicon film is obtained on a glass substrate using the nickel elements. FIGS. 12A to 12D show a producing process of this embodiment. A silicon nitride oxide film 152 having a thickness of 3000 Å is formed as an under film on a Corning 1737 glass substrate 151 (a strain point of 667° C.) by plasma CVD using silane, $N_2O$ gas and oxygen as raw gases, or plasma CVD using TEOS gas and $N_2O$ gas.

The silicon nitrogen oxide film 152 functions to strongly prevent the diffusion of impurities from the glass substrate in a later process (a large amount of impurities are contained in the glass substrate from the viewpoint of the producing level of the semiconductor.).

In order to obtain the above function at the largest, a silicon nitride film is optimum, but it is not practical since the silicon nitride film is peeled from the glass substrate in relation to a stress. Also, a silicon oxide film can be used as an under film. However, the silicon oxide film has an insufficient barrier effect with respect to impurities.

It is important to make the hardness of the under film as high as possible. It has been proved, under the withstand test of the TFT finally obtained, that as the hardness of the under film is high (that is, its etching rate is small), its reliability becomes higher. This is because the hardness of the under film is related to the prevention of impurities from entering from the glass substrate.

An amorphous silicon film 153 which will be transformed into a crystalline silicon film later is formed with a thickness of 500 Å by low pressure thermal CVD. The reason why low pressure thermal CVD is used is because the quality of the crystalline silicon film which will be obtained later is excellent. Plasma CVD may be used as a method other than low pressure thermal CVD. The thickness of the amorphous silicon film 153 is preferably 2000 Å or less.

Figure 12A:
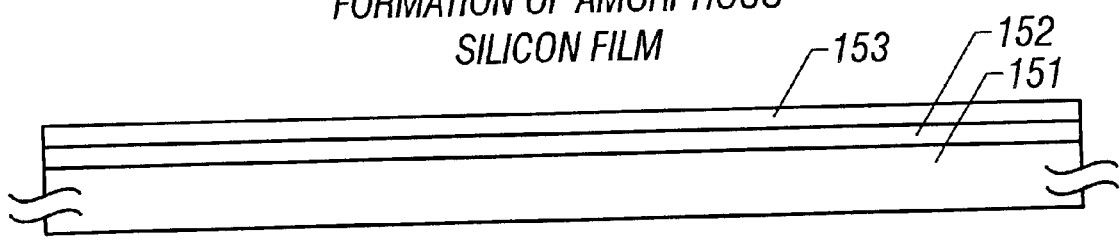
FIGS. 12A to 12D show a process of obtaining a crystalline silicon film.
Figure 12B:
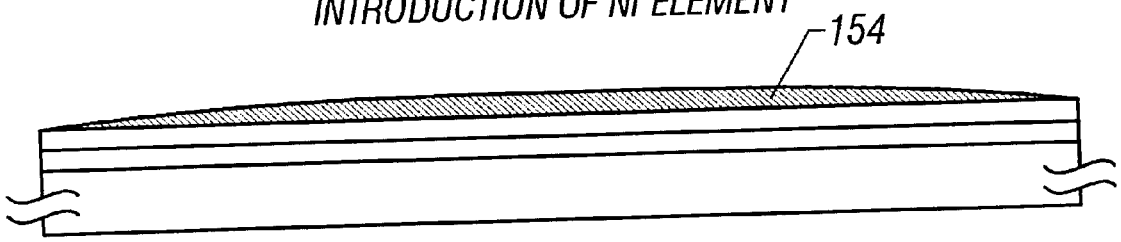

The lower limit of the thickness of the amorphous silicon film 153 depends on a degree that a thin film can be formed. In general, the lower limit is about 100 Å, in practical use, about 200 Å. In this stage, it is important that the greatest attention is paid so that impurities are not mixed into the film. Thus, a state of FIG. 12A is obtained.

A nickel acetate solution containing the nickel elements of 10 ppm (weight conversion) is applied on the surface of the amorphous silicon film 153. That is, a water film 154 of the nickel acetate solution is formed on the surface of the amorphous silicon film 153, in FIG. 12B, and an excessive solution is blown off using a spin coater. In other words, a spin dry is conducted. Thus, the nickel elements are disposed in contact with the surface of the amorphous silicon film 153.

In view of the remaining impurities in a later heating process, the nickel acetate solution is preferably replaced by nickel sulfate. This is because the nickel acetate solution contains carbon, and it may be carbonized in the subsequent heat treatment and remain in the film. The quantity of the introduced nickel elements can be adjusted by the concentration of the nickel elements in the solution.

Figure 12C:
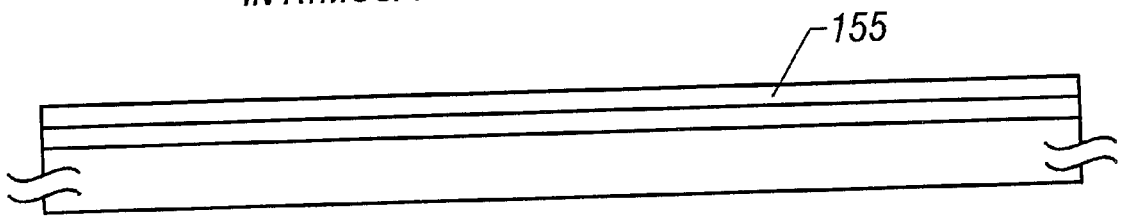

Then, in FIG. 12C, a heat treatment is conducted at 450 to 650° C. to crystallize the amorphous silicon film 153. The heat treatment is conducted in the atmosphere containing halogen elements, in this example, the nitrogen atmosphere containing HCl of 3%. This is because gettering (removal) of the nickel elements are performed by the action of chlorine at the same time as crystallization.

The concentration of HCl in the atmosphere is preferably 1 to 10%. When the concentration is more than that value, an attention must be paid because the surface of the silicon film becomes rough. When the concentration is less than that value, the gettering effect is lowered.

Also, it is important to reduce oxide as much as possible in the atmosphere in the above heat treatment. This is because nickel is reacted with oxygen so that $NiO_x$ is formed on the surface of the film or in the film. Specifically, the atmosphere may be preferable so that the content of oxygen is of ppm order, preferably 1 ppm or less.

Further, for the purpose of suppressing the phenomenon that $NiO_x$ is formed, it is useful to conduct the above heat treatment in the reducing atmosphere. For example, it is effective that hydrogen of 3% (it is necessary to consider an explosion limit) is mixed in the nitrogen atmosphere (it may be argon) and HCl of 1 to 10% is further mixed in the atmosphere.

The lower limit of the above heat treatment temperature is preferably 450° C. or higher from the viewpoint of its effect and reproducibility. The upper limit is necessarily set to be the strain point of the glass substrate 151 to be used, or less. In this example, since the Corning 1737 glass substrate 151 having a strain point of 667° C. is used, its upper limit is set to be 650° C. with some margin.

Hence, the use of a quartz substrate enables the heat temperature to be elevated up to about 900° C. In this case, there can be obtained the crystalline silicon film having a higher crystallinity. Also, the crystalline silicon film can be obtained in a shorter time.

As a gas other than HCl, one kind or plural kinds of materials selected from HF, HBr, $Cl_2$, $F_2$ and $Br_2$ can be used. The content (volume content) of the gas in the atmosphere is preferably set to be 0.3 to 10% when the gas is HF, 1 to 20% when it is HBr, 0.3 to 5% when it is $Cl_2$, 0.1 to 3% when it is $F_2$, and 0.3 to 10% when it is $Br_2$.

After a crystalline silicon film 155 is obtained by the heat treatment in FIG. 12C, a heat treatment is again conducted in the solution containing halogen elements. It is very important that the heat treatment is conducted at a temperature higher than that of the above heat treatment that has been conducted for crystallization. This process is to remove the nickel elements (metal elements that promote the crystallization) which is intentionally mixed for crystallization at an initial stage. The metal element that promotes the crystallization of silicon and is represented by nickel is very useful in crystallization of the amorphous silicon film 153, and plays an important role when crystallization.

Figure 12D:
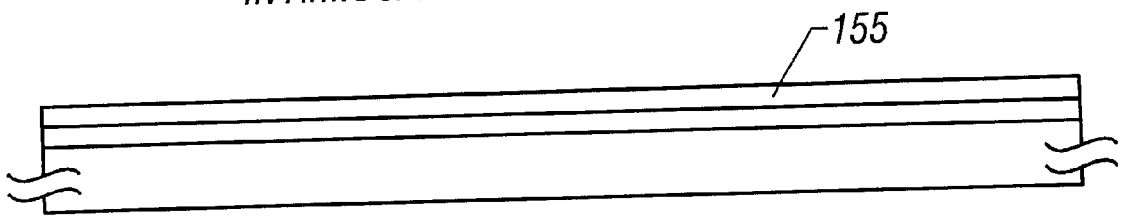

However, after the crystalline silicon film 155 is obtained, the metal element forms a level in the semiconductor or acts as an unstable element. Therefore, the metal elements are desirably removed as much as possible. Thus, in this example, a heat treatment is again conducted in the atmosphere containing halogen elements (FIG. 12D).

The heat treatment is preferably conducted at 550 to 1050° C., more preferably 600 to 980° C. This is because when the heat temperature is 600° C. or lower, its effect cannot be obtained, and when it exceeds 1050° C., a substrate holder formed of a quartz or the like may be warped, or a load may be applied to the apparatus (for that reason, 980° C. or lower is preferable)

The upper limit of the heat treatment temperature is necessarily the strain point of the glass substrate 151 or less An attention must be paid since the substrate is deformed when the heat treatment is conducted at the strain point of the glass substrate 151 or more.

The atmosphere in the second heat treatment may be the same as that is the first crystallization. In this heat treatment, a heating time is 10 to 48 hours, representatively 24 hours when the heat temperature is 600 to 750° C. Also, it is 5 to 24 hours, representatively 12 hours when the heat temperature is 750 to 900° C. Further, it is 1 to 12 hours, representatively 6 hours when the heat temperature is 900 to 1050° C.

Through the above process, the concentration of the nickel elements in the crystalline silicon film 155 can be set to be 1/10 or less of the initial concentration. This means that the nickel elements can be set to be 1/10 or less in comparison with a case in which gettering due to the halogen elements is not conducted. The same effect is obtained similarly in case of using other metal elements. The effect can be enhanced by increasing a time or a temperature in the second heat treatment.

With the second heat treatment, the nickel elements are diffused, thereby preventing the nickel elements from being locally concentrated.

The fifteenth embodiment shows an example in which a solution is used for introducing the nickel elements because of its good controllability and simple nature. However, there may be used a method of forming nickel or a film containing nickel by CVD or sputtering. Also, there may be used a method of disposing the nickel elements in contact with the surface of the amorphous silicon film 153 by the suction technique. This can be applied similarly to a case of using another metal element that promotes the crystallization of silicon.

(Sixteenth Embodiment)

A sixteenth embodiment relates to an example of conducting crystal growth in a different manner from the fifteenth embodiment. This embodiment relates to a method of conducting crystal growth in a direction parallel to a substrate called "a lateral growth" using a metal element that promotes the crystallization of silicon.

FIGS. 13A to 13D show a producing process in accordance with this embodiment. A silicon nitride oxide film 202 having a thickness of 3000 Å is formed as an under film on a Corning 1737 glass substrate (it may be a quartz glass).

An amorphous silicon film 203 having a thickness of 500 Å is formed on the silicon nitride oxide film 202 by low pressure thermal CVD. The thickness of the amorphous silicon film is preferably 2000 Å or less as described above.

Then, a silicon oxide film having a thickness of 1500 Å is formed and then patterned to form a mask 204. The mask 204 has an opening formed in a region 205, and the amorphous silicon film 203 is exposed in that region.

An opening 205 has a slender rectangle shape having a longitudinal direction in a direction perpendicular to the drawing paper. The width of the opening 205 may be set to be 20 μm or more. The length of its longitudinal direction may be arbitrarily determined.

Figure 13A:
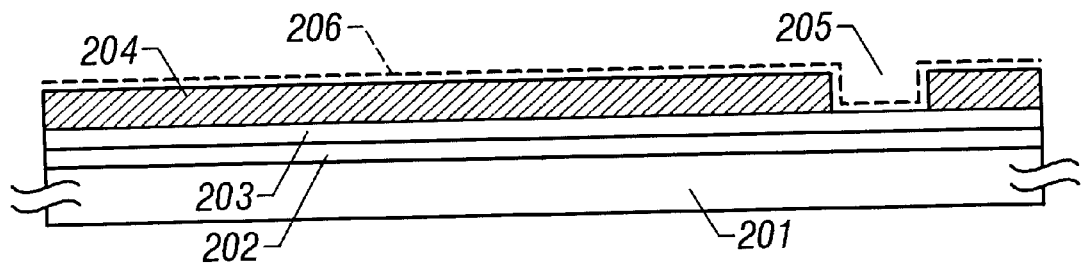
FIGS. 13A to 13D show a process of obtaining a crystalline silicon film.
Figure 13B:
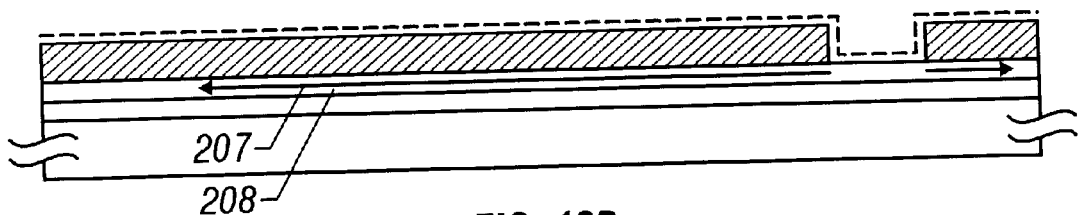

A nickel acetate solution containing the nickel elements of 10 ppm in weight conversion described in the fifteenth embodiment is applied. Thus, the nickel elements are disposed in contact with the surface of the exposed amorphous silicon film and the surface of the mask 204 formed of a silicon oxide film, as indicated by a dotted line 206 (FIG. 13A).

Then, a heat treatment at 600° C. for 4 hours is conducted in the nitrogen atmosphere containing oxygen as little as possible. As a result, crystal growth is progressed in parallel to the substrate as indicated by an allow 207 of FIG. 13B. The crystal growth is progressed from the region of the opening 205 into which the nickel elements are introduced toward the periphery thereof. The crystal growth in a direction parallel to the substrate is called "lateral growth".

It is very useful to conduct the first heat treatment for crystallization in the reducing atmosphere.

The lateral growth can be performed over 100 μm or more. A silicon film 208 having a laterally growing region is obtained. In the region where the opening 205 is formed, a perpendicular crystal growth called "a longitudinal growth" is progressed from the surface of the silicon film 203 toward an interface between the silicon film 203 and the under film 202.

Figure 13C:
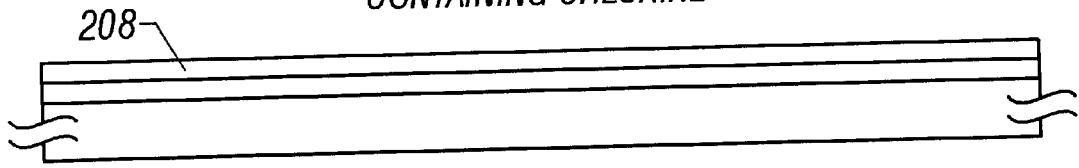
Figure 13D:
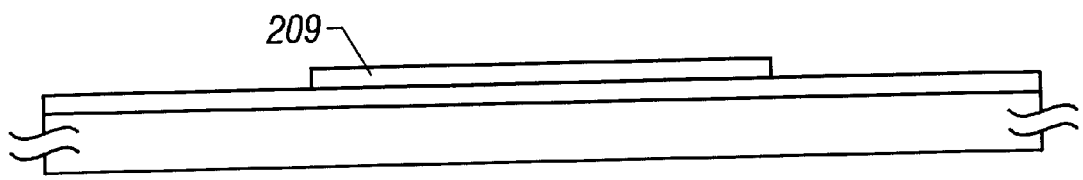

Then, a mask 204 formed of a silicon oxide film for selectively introducing the nickel elements is removed to obtain a state of FIG. 13C. In this state, a longitudinal growth region, a lateral growth region and a region which is not subjected to the crystal growth (having an amorphous state) exist in the silicon film 208.

In this state, a heat treatment at 640° C. for 12 hours is conducted in the nitrogen atmosphere containing HCl of 3% and hydrogen of 3%. Thus, as described in the fifteenth embodiment, the concentration of the nickel elements in the film can be reduced. With the second heat treatment, the nickel elements locally concentrated can be diffused, and a problem caused by locally concentrating the nickel elements can be solved. In other words, a problem such as the formation of a high density trap level or the exhibition of a metallic electric characteristic can be suppressed.

A pattern 209 formed of a lateral growth region is formed by patterning. In this example, it is important that none of the longitudinal growth region, the amorphous region and the end portion of the lateral growth region exist in the pattern 209. This is because in the end portions of the longitudinal growth and the lateral growth, the nickel elements are contained with a relatively high concentration. This is because the amorphous silicon region is degraded in its electric characteristic.

The concentration of the nickel elements remaining in the pattern 209 of the lateral growth region can be made still lower than that in the fifteenth embodiment. This is caused by the fact that the concentration of the metal elements contained in the lateral growth region is naturally low. Specifically, the concentration of the nickel elements in the pattern 209 of the lateral growth region can be set to the order of $10^{17}$ cm$^{-3}$.

When the TFT is formed using the lateral growth region, higher mobility can be obtained than that in the longitudinal growth described in the fifteenth embodiment (in the fifteenth embodiment, the overall surface longitudinally grows).

Since the concentration of the nickel can be lowered, high reliability can be obtained as the device.

(Seventeenth Embodiment)

A seventeenth embodiment shows an example of producing a TFT disposed in the pixel region of an active matrix liquid crystal display unit or an active matrix EL (electroluminescence) display unit in accordance with the present invention.

FIGS. 14A to 14E show a producing process according to the present invention. A crystalline silicon film is formed by the process of the fifteenth embodiment or the sixteenth embodiment and then patterned to obtain a state shown in FIG. 14A.

Figure 14A:
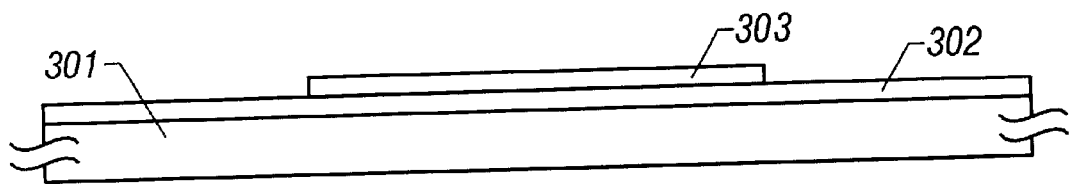
FIGS. 14A to 14E show a process of producing a TFT.

In FIG. 14A, numeral 301 is a glass substrate, 302 is an under film, and 303 is an active layer formed of a crystalline silicon film. The under film 302 is preferably formed of a silicon nitrogen oxide film. Also, it is desirable that halogen elements are contained in the silicon nitride oxide film. This is to utilize the gettering action of metal ions or mobile ions caused by the halogen elements.

After the state of FIG. 14A, a silicon nitride oxide film 304 having a thickness of 1000 Å as a gate insulating film is formed on the surface. Plasma CVD using a mixture gas containing oxygen, silane and N$_2$O, or plasma CVD using a mixture gas containing TEOS and N$_2$O are used for the film forming method.

The halogen elements contained in the silicon nitride oxide film 304 is useful to prevent a function of the gate insulating film as an insulating film from being degraded by an influence of the nickel elements (or metal elements that promote the crystallization of silicon) existing in the active layer. The use of the silicon nitride oxide film 304 is significant because the fine quality of the film 304 makes it difficult that the metal elements enter in the film 304. The metal elements entering in the gate insulating film permits the function of the gate insulating film to be degraded as an insulating film, which leads to the instability or dispersion of the characteristic of the TFT. The gate insulating film may be formed of a silicon oxide film that is usually used.

After the silicon nitride oxide film 304 that functions as the gate insulating film is formed, an aluminum film that functions as a gate electrode later is formed by sputtering. Scandium of 0.2 weight % is contained in the aluminum film.

That scandium is contained in the aluminum film is because the generation of hillock or whisker is suppressed in a later process. The hillock and whisker means that aluminum abnormally grows by heating, resulting in the formation of a needle-like or sharp protrusion.

After the formation of the aluminum film, a fine anodic oxide film (not shown) is formed using an ethylene glycol solution containing tartaric acid of 3% as an electrolyte. That is, in the electrolyte, anodization is conducted with an aluminum film as an anode and platinum as a cathode, to form the anodic oxide film having a fine quality of the surface of the aluminum film. The thickness of the anodic oxide film is about 100 Å. The anodic oxide film has a function for improving the adhesion of the aluminum film to a resist mask which will be formed later. The thickness of the anodic oxide film can be controlled by an applied voltage at the anodization.

Figure 14B:
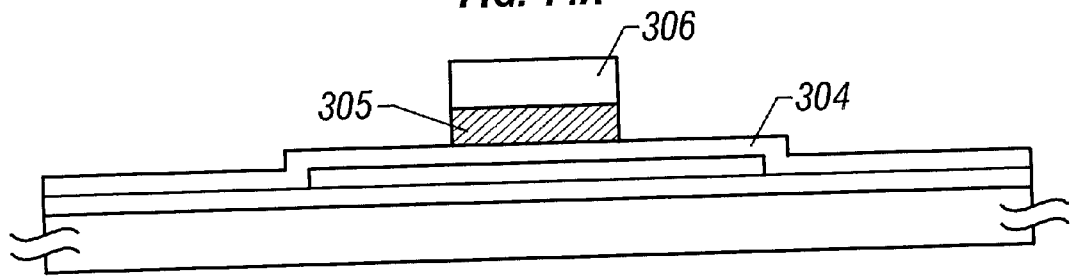
Figure 14C:
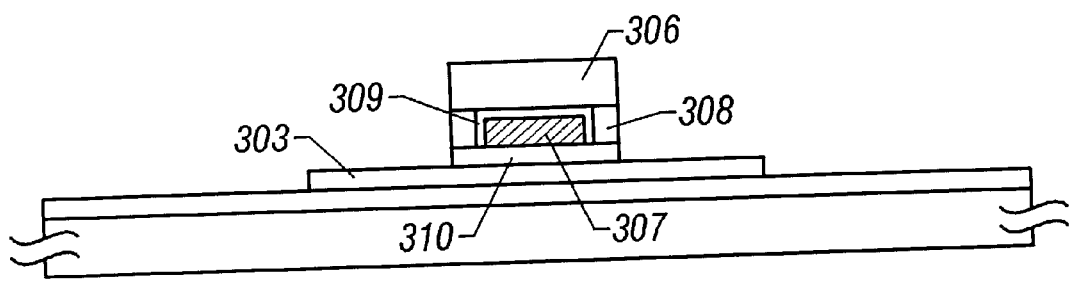

A resist mask 306 is formed. Then, the aluminum film is patterned into a pattern 305. Thus, a state of FIG. 14B is obtained. In this situation, the anodization is again conducted using an oxalic aqueous solution of 3% as electrolyte. In the electrolyte, the anodization is conducted with the aluminum pattern 305 as an anode, to form a porous anodic oxide film 308. In this process, the anodic oxide film 308 is selectively formed on the side surface of the aluminum pattern because the resist mask 306 having high adhesion exists on the upper portion.

The anodic oxide film 308 is allowed to grow up to several μm in thickness. Its thickness is 6000 Å. The growth distance can be controlled in accordance with an anodization time.

Then, a fine anodic oxide film is again formed. That is, the anodization is again conducted using an ethylene glycol solution containing tartaric acid of 3% as an electrolyte. As a result, the anodic oxide film 309 having a fine quality is formed because the electrolyte enters into the porous anodic oxide film 308. The thickness of the fine anodic oxide film 309 is 1000 Å.

In this situation, the exposed silicon nitride oxide film 304 is etched, thereby allowing only a region 310 to remain. The etching is usefully conducted by using dry etching. Further, using a mixed acid containing acetic acid, nitric acid and phosphoric acid, the porous anodic oxide film 308 is removed. In this way, a state of FIG. 14D is obtained.

Figure 14D:
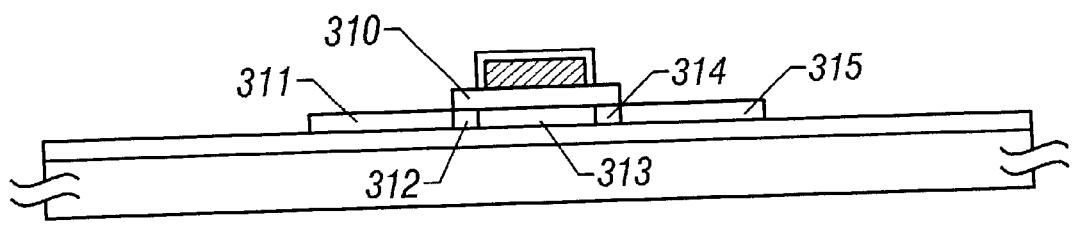

After the state of FIG. 14D, impurity ions are implanted. In this example, the implantation of P (phosphorus) ions is conducted by plasma doping to produce the n-channel TFT.

In this process, there-are formed regions 311 and 315 which are heavily doped and regions 312 and 314 which are lightly doped. This is because portions of the remaining silicon oxide film 310 functions as a semitransparent mask, and parts of the implanted ions are blocked by the mask.

Then, a laser beam or an intense light is irradiated to activate the region into which impurity ions have been implanted. Thus, a source region 311, a channel forming region 313, a drain region 315, and low concentration impurity regions 312 and 314 are formed in a self-alignment. The regions 312 and 314 are called "LDD (lightly doped drain) region" (FIG. 14D).

When the thickness of the fine anodic oxide film 309 is thickened to 2000 Å or more, offset gate regions can be formed at the outside of the channel forming region 313 with that film thickness. Similarly in this embodiment, the offset gate regions are formed. However, since the contribution of its existence is small because of its small dimensions and drawings become complicated, such offset gate regions are not shown.

Figure 14E:
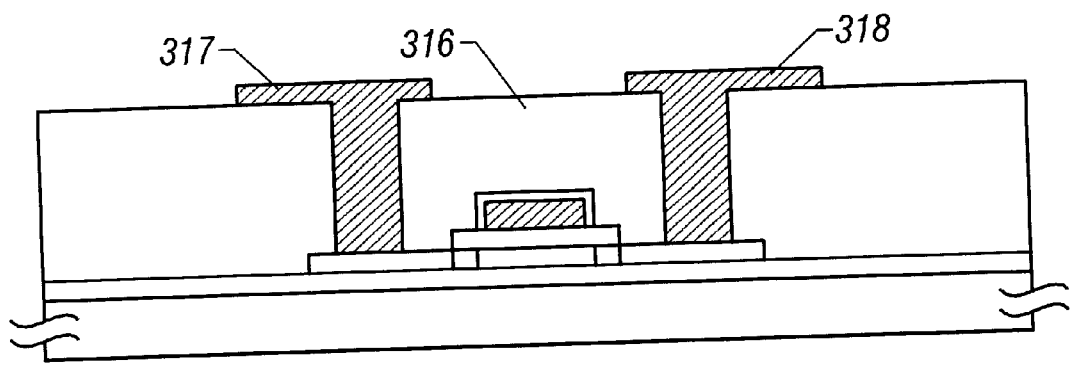

A silicon oxide film, a silicon nitride film or a laminate film thereof is formed as an interlayer insulating film 316. The interlayer insulating film 316 may be constructed by forming a layer made of a resin material on a silicon oxide film or a silicon nitride film. Contact holes are formed so that a source electrode 317 and a drain electrode 318 are formed. In this way, a TFT shown in FIG. 14E is produced.

(Eighteenth Embodiment)

An eighteenth embodiment relates to a method of forming a gate insulating film 304 in the third embodiment. In case of using a quartz substrate or a glass substrate having high heat resistance as a substrate, the thermal oxidation is preferably used as the method of forming a gate insulating film. The oxide film formed by the thermal oxidation is one of the optimum oxide films as the gate insulating film, since it is fine as the insulating film and no movable charge exists inside thereof.

As the method of forming the thermal oxide film, there is an example of processing in the oxidizing atmosphere at 950° C. In this situation, it is effective to mix the oxidizing atmosphere with HCl or the like. Thus, the metal elements existing in the active layer can be removed simultaneously when the thermal oxide film is formed.

Also, it is effective to mix the oxidizing atmosphere with $N_2O$ gas, to form a thermal oxide film containing a nitrogen component. If the mixing ratio of $N_2O$ gas is optimized, a silicon nitride oxide film can be obtained by thermal oxidation.

This embodiment shows an example of forming the gate insulating film by thermal oxidation. However, as another method, a gate insulating film can be formed by thermal CVD. Similarly in this case, it is effective to containing a nitrogen component in the thermal oxide film, using $N_2O$ or ammonia.

(Nineteenth Embodiment)

A nineteenth embodiment shows an example of producing a TFT through a process different from that shown in FIGS. 14A to 14E. FIGS. 15A to 15E show a producing process in accordance with this embodiment. A crystalline silicon film is formed on a glass substrate by the process of the fifteenth embodiment or the sixteenth embodiment. Then, the crystalline silicon film is patterned to obtain a state of FIG. 15A.

Figure 15A:
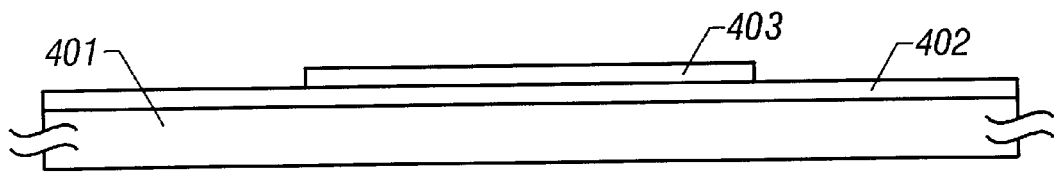
FIGS. 15A to 15E show a process of producing a TFT.

In FIG. 15A, numeral 401 is a glass substrate, 402 is an under film, and 403 is an active layer formed of a crystalline silicon film. The under film 402 is preferably formed of a silicon nitride oxide film.

After the state of FIG. 15A, a silicon nitride oxide film 404 having a thickness of 1000 Å as an gate insulating film is formed. Plasma CVD using the mixture gas containing oxygen, silane and $N_2O$, or plasma CVD using the mixture gas containing TEOS and $N_2O$ are used as the film forming method. The gate insulating film may be formed of a silicon oxide film usually used.

After forming the silicon nitride oxide film 304 that functions as the gate insulating film, an aluminum film that functions as a gate electrode later (not shown) is formed by sputtering. Scandium of 0.2 weight % is contained in the aluminum film.

After forming the aluminum film, a fine anodic oxide film (not shown) is formed using an ethylene glycol solution containing tartaric acid of 3% as an electrolyte. That is, in the electrolyte, anodization is conducted with an aluminum film as an anode and platinum as a cathode, to form the anodic oxide film having a fine quality of the surface of the aluminum film.

The thickness of the anodic oxide film having the fine quality is about 100 Å. The anodic oxide film has a function for improving the adhesion of the aluminum film to a resist mask that will be formed later. The thickness of the anodic oxide film can be controlled by an applied voltage at anodization.

Figure 15B:
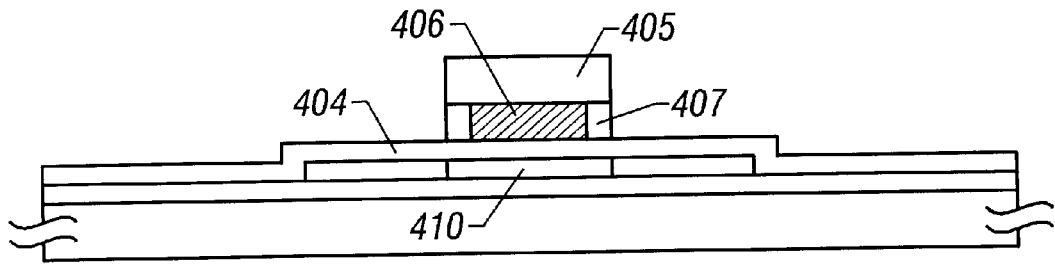

A resist mask 405 is formed. Then, the aluminum film is patterned into a pattern 406. In this situation, the anodization is again conducted using an oxalic aqueous solution of 3% as electrolyte. In the electrolyte, the anodization is conducted with the aluminum pattern 406 as an anode, to form a porous anodic oxide film 407 (FIG. 15B).

In this process, the anodic oxide film 407 is selectively formed on the side surface of the aluminum film 406 because the resist mask 405 having high adhesion exists on the upper portion. The anodic oxide film 407 is allowed to grow up to several $\mu$m in thickness. Its thickness is set to be 6000 Å. The growth distance can be controlled by the anodization time.

Then, a fine anodic oxide film is again formed. That is, the anodization is again conducted using an ethylene glycol solution containing tartaric acid of 3% as an electrolyte. Thus, the anodic oxide film 408 having a fine quality is formed because the electrolyte enters into the porous anodic oxide film 407.

Figure 15C:
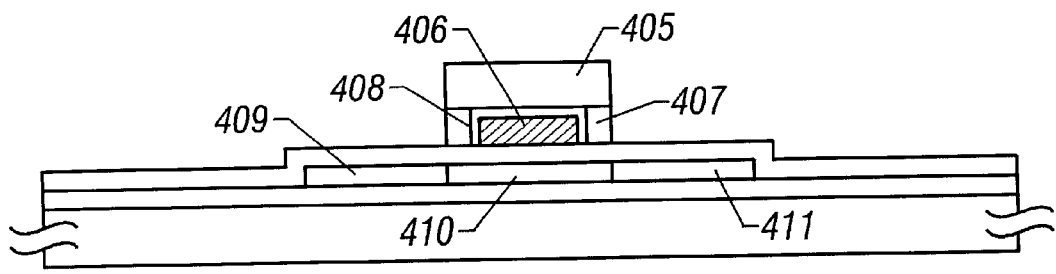
Figure 15D:
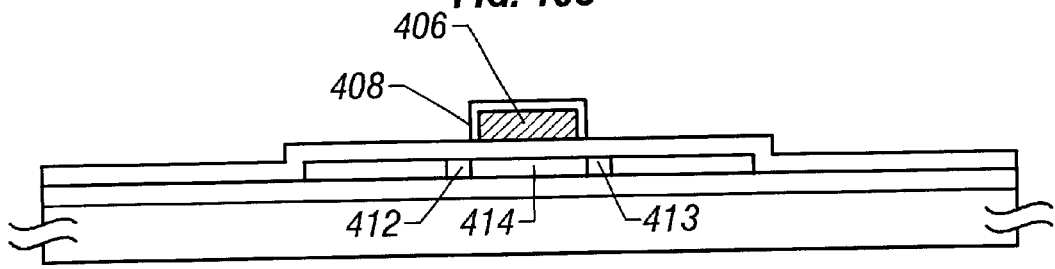

In this situation, impurity ions are initially implanted. This process may be conducted after the resist mask 405 is removed. With the implantation of the impurity ions, a source region 409 and a drain region 411 are formed. The impurity ions are not implanted into a region 410 (FIG. 15C).

Then, using a mixed acid containing acetic acid, nitric acid and phosphoric acid, the porous anodic oxide film 307 is removed.

After removing the film 307, impurity ions are again implanted under the doping condition lighter than the condition of the initial impurity ion implantation. In this process, LDD regions 412 and 413 are formed. Then, a region 414 becomes a channel forming region.

Thereafter, a laser beam or an intense light is irradiated, to activate the region into which impurity ions have been implanted. In this way, a source region 409, a channel forming region 414, a drain region 411, and low concentration impurity regions 412 and 413 are formed in the self-alignment.

Figure 15E:
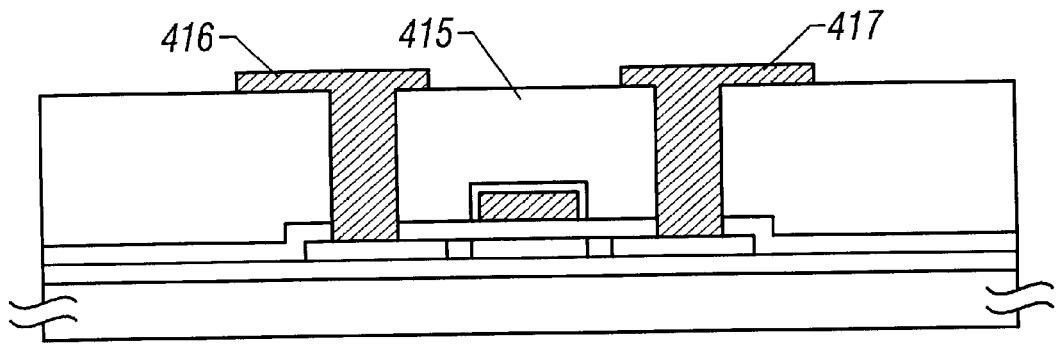

A silicon oxide film, a silicon nitride film or a laminate film thereof is formed as an interlayer insulating film 415. The interlayer insulating film 415 may be formed by a layer made of a resin material on a silicon oxide film or a silicon nitride film. Contact holes are formed so that a source electrode 416 and a drain electrode 417 are formed. In this way, a TFT shown in FIG. 15E is produced.

(Twentieth Embodiment)

A twentieth embodiment relates to an example in which an n-channel TFT and a p-channel TFT are constituted in the complementary manner. The structure of this embodiment can be used, for example, in a variety of thin film integrated circuit integrated on the insulating surface. Also, it can be used, for example, in a peripheral drive circuit of the active matrix liquid crystal display device.

Figure 16A:
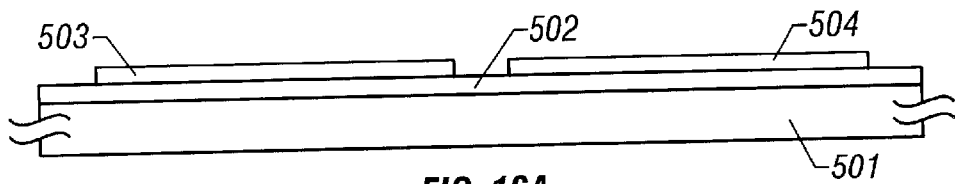
FIGS. 16A to 16F show a process of producing a TFT.

A silicon oxide film or a silicon nitride oxide film are formed on a glass substrate 501 as an under film 502, as shown in FIG. 16A. Preferably, the silicon nitride oxide film is used.

Further, an amorphous silicon film (not shown) is formed by plasma CVD or low pressure thermal CVD. Also, the amorphous silicon film is transformed into a crystalline silicon film by the method of the fifteenth embodiment or the sixth embodiment.

The crystalline silicon film is patterned to obtain active layers 503 and 504. Thus, a state of FIG. 16A is obtained.

In order to suppress the influence of carriers that move on the side surface of the active layers 503 and 504, in the state of FIG. 16A, a heat treatment is conducted at 650° C. for 10 hours in the nitrogen atmosphere containing HCl of 3%.

When the trap level caused by the existence of the metal elements exists on the side surface of the active layers 503 and 504, this leads to the deterioration of the off current characteristic. Thus, it is useful to conduct the processing described here to lower the density of the level at the side surface of the active layer.

A silicon nitride oxide film 505 that constitutes the gate insulating film is formed. If quartz is used for a substrate, the above thermal oxidation is preferably used.

Then, an aluminum film having a thickness of 4000 Å (not shown) is formed to constitute the gate electrode later. Other than the aluminum film, an anodizable metal (for example, tantalum) is available.

After the aluminum film is formed, an extremely thin fine anodic oxide film is formed on its surface by the above method.

A resist mask (not shown) is formed on the aluminum film, and the aluminum film is patterned to form gate electrodes 506 and 507. Then, the anodization is conducted with the gate electrodes 506 and 507 as an anode, to form porous anodic oxide films 508 and 509. The thickness of the porous anodic oxide film is, for example, 5000 Å.

Figure 16B:
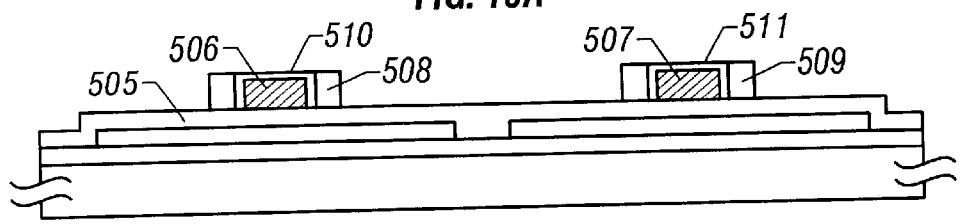

The anodization is again conducted under the condition of forming a fine anodic oxide film, to form fine anodic oxide films 510 and 511. The thickness of the fine anodic oxide films 510 and 511 is 800 Å. Thus, a state of FIG. 16B is obtained.

Figure 16C:
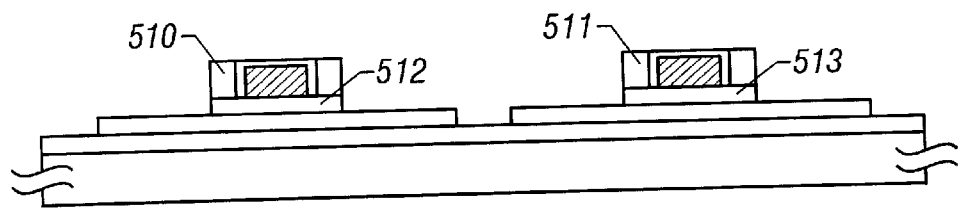

Further, the exposed silicon oxide film 505 is removed by dry etching, to obtain a state of FIG. 16C.

Figure 16D:
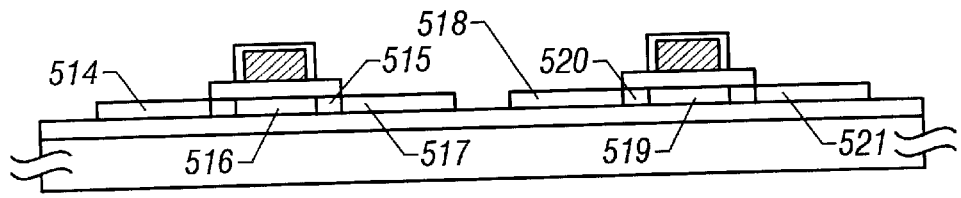

After the state of FIG. 16C, using a mixed acid containing acetic acid, nitric acid and phosphoric acid, the porous anodic oxide films 508 and 509 are removed. In this way, a state of FIG. 16D is obtained.

In this example, resist masks are alternately arranged, and P ions are implanted into the left TFT whereas B ions are implanted into the right TFT. With the implantation of P ions, a source region 514 and a drain region 517 each having a high concentration n-type are formed in the self-alignment. Also, there is formed a region 515 having a weak n-type which is doped with P ions at a low concentration. Also, a channel forming region 516 is simultaneously formed.

The reason why the region 515 having the weak n-type is formed is that the remaining gate insulating film 512 exists. In other words, the P ions that transmit the gate insulating film 512 are partially blocked by the gate insulating film 512.

By implanting the B ions, a source region 521 having a strong p-type and a drain region 518 are formed in the self-alignment through the same principle. Also, a low concentration impurity region 520 is simultaneously formed. Similarly, a channel forming region 519 is simultaneously formed.

When the fine anodic oxide films 510 and 511 are thickened to 2000 Å, offset gate regions can be formed in contact with the channel forming regions 516 and 519 with that thickness.

In this embodiment, since the thickness of the fine anodic oxide films 510 and 511 is 1000 Å or less and these films are thin, the existence of the offset gate regions can be ignored. Then, a laser beam or an intense light is irradiated to anneal the regions into which the impurity ions have been implanted.

Figure 16E:
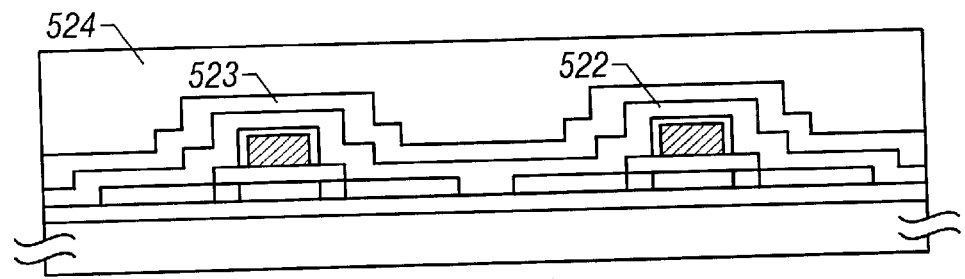
Figure 16F:
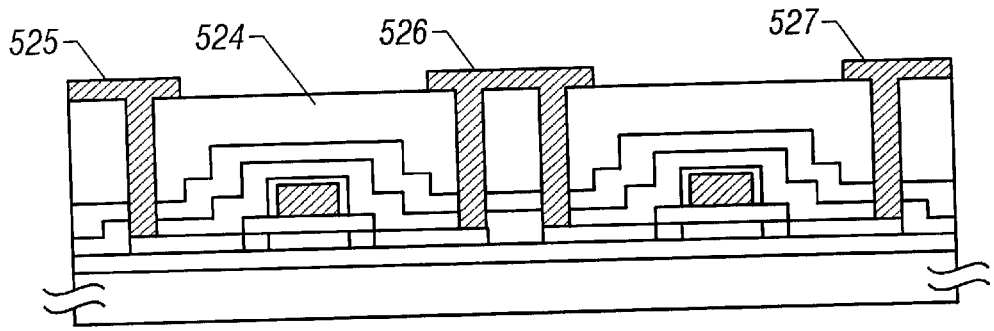

In FIG. 16E, a silicon nitride film 522 and a silicon oxide film 523 are formed as an interlayer insulating film. The thickness of the respective films 522 and 523 is 1000 Å. No silicon oxide film 523 may be formed.

In this example, the TFT is covered with the silicon nitride film 522. Since the silicon nitride film 522 is fine and excellent in boundary characteristic, the reliability of the TFT can be enhanced with such a structure.

An interlayer insulating film 524 made of a resin material is formed by spin coating. The thickness of the interlayer insulating film 524 is 1 μm (FIG. 16E).

Then, contact holes are formed, and a source electrode 525 and a drain electrode 526 of the left-sided n-channel TFT are formed. Simultaneously, a source electrode 527 and a drain electrode 526 of the right-sided n-channel TFT are formed, the drain electrode 526 are commonly arranged.

In the above manner, the TFT circuit having the CMOS structure of the complementary type can be produced. In the structure described in this embodiment, the TFT is coated with a nitride film and further with a resin material. This structure can make it hard that the mobile ions or moisture enters the TFT, resulting in a high durability.

Also, in case of further forming a multilayer wiring, a capacitance can be prevented from being formed between the TFT and the wiring.

(Twenty-first Embodiment)

A twenty-first embodiment relates to a structure in which a single-crystal or a substantially single-crystal like region is formed by further irradiating a laser light onto the crystalline silicon film obtained by the fifteenth embodiment or the sixteenth embodiment.

As described in the fifteenth embodiment, a crystalline silicon film is obtained using nickel elements. Then, an excimer laser light (for example, KrF excimer laser beam) is irradiated onto that film, to further promote its crystallinity.

The film that the crystallization is largely promoted in the above manner is $3 \times 10^{17}$ cm$^{-3}$ or less in the concentration of the electronic spin which is measured by ESR (electron spin resonance), $3 \times 10^{17}$ cm$^{-3}$ or less in the concentration of the nickel elements as the lowest one of the values measured by SIMS, and has a region that can be regarded as single-crystal.

In the region, there exists substantially no grain boundary, and there can be obtained the electric characteristic as high as that of the single-crystal silicon wafer. Also, the single-crystal like region contains hydrogen of about 5 atoms % or less to $1 \times 10^{15}$ cm$^{-3}$. The value is proved through the measurement due to SIMS.

The TFT is manufactured using such a single-crystal or single-crystal like region, thereby obtaining what is equivalent to the MOS transistor manufactured using a single-crystal wafer.

(Twenty-second Embodiment)

A twenty-second embodiment shows an example in which a gate insulating film is manufactured by thermal CVD in the process of producing the TFT as shown in FIGS. 14A to 16F. In case of forming the gate insulating film by thermal CVD, it is necessary to heat the gate insulating film at a high temperature. Thus, it is desirable to use quartz as a substrate.

This embodiment shows an example in which, using an oxygen gas containing HCl of 3% at the volume ratio, the gate insulating film is formed by low pressure thermal CVD. In the gate insulating film obtained in this manner, the entering of the metal elements existing in the active layer can make it hard to change its electric characteristic.

(Twenty-third Embodiment)

A twenty-third embodiment is characterized in that in the process described in the fifteenth embodiment or the sixteenth embodiment, the second heat treatment is conducted in the atmosphere mainly containing oxygen. For example, HCl of 3% is contained in the oxygen atmosphere, and the second heat treatment is conducted in that atmosphere.

As described above, in the first heat treatment for crystallization, it is not preferable that oxygen exists in the atmosphere because nickel oxide is locally formed. However, in the second heat treatment, since there is a little metal element existing on the surface, there arises particularly no problem even if the oxygen is mainly contained in the atmosphere.

When the oxygen is mainly contained in the atmosphere during the second heat treatment, an extremely-thin oxide film (thermal oxide film) is formed on the surface of the silicon film simultaneously when the heat treatment is conducted. The oxide film has an excellent interface characteristic, and effectively functions as the under film (finally integrated with the gate insulating film) of the later gate insulating film.

Also, the oxide film functions as a protective film that protects the silicon film. In particular, when the irradiation of a laser beam is further conducted after the second heat treatment, it is very useful that the oxide film exists. That is, the oxide film becomes a protective film which is effective in minimizing the roughness of the surface of the film caused by the irradiation of a laser beam.

(Twenty-fourth Embodiment)

A twenty-fourth embodiment shows an example in which in the process described in the fifteenth embodiment, nickel elements are introduced directly onto the surface of the under film. In this example, the nickel elements are disposed in contact with the lower surface of the amorphous silicon film.

As described above, according to the present invention, a crystalline silicon film very excellent in crystallinity can be obtained. In particular; using metal elements that promote the crystallization of silicon, a high crystallinity can be obtained. Using metal elements that promote the crystallization of silicon, a period of time necessary for crystallization can be shortened. Even though a glass substrate is large-scaled in area, the flatness of its surface is maintained, the crystalline silicon film having a high crystallinity can be formed on the glass substrate. Using a quartz substrate, a heat treatment is conducted at a high temperature of 800 to 1100° C., thereby preventing the metal elements from being locally concentrated. Because of a high crystallinity, the TFT having a high mobility can be produced. Since a high crystallinity is provided and the metal elements are not concentrated, the TFT having low in the off current value and high in reliability can be constituted.

What is claimed is:

1. A method for producing a semiconductor device comprising the steps of:
    forming a semiconductor film comprising silicon on an insulating surface over a substrate;
    disposing in contact with the semiconductor film a catalyst material that promotes crystallization of silicon; and
    crystallizing the semiconductor film by heating the semiconductor film and the catalyst material at 800° C. to 1100° C.

2. A method for producing a semiconductor device comprising the steps of:
    forming a semiconductor film comprising silicon on an insulating surface over a substrate;
    applying onto the semiconductor film a solution containing a catalyst material that promotes crystallization of silicon; and
    crystallizing the semiconductor film by heating said semiconductor film and said catalyst material at 800° C. to 1100° C.

3. A method for producing a semiconductor device comprising the steps of:
    forming a semiconductor film comprising amorphous silicon on an insulating surface over a substrate;
    disposing in contact with the semiconductor film a catalyst material that promotes crystallization of silicon; and
    crystallizing the semiconductor film by heating the semiconductor film and the catalyst material at a temperature higher than a crystallization temperature of said semiconductor film by at least 200° C.

4. A method for producing a semiconductor device comprising the steps of:
    forming an amorphous silicon film on an insulating surface over a substrate;
    etching said amorphous silicon film to form an island region having a diameter of 200 μm or less;
    disposing in contact with a surface of the island region a metal element that promotes crystallization of silicon; and
    crystallizing the island region using the metal element by thermally processing the island region at 800° C. to 1100° C.

5. A method of producing a semiconductor device comprising the steps of:
    forming an amorphous silicon film on an insulating surface over a substrate;
    etching said amorphous silicon film to form an island region having a diameter of 200 μm or less;
    disposing in contact with a surface of the island region a metal element which promotes crystallization of silicon;
    crystallizing the island region using the metal element by thermally processing the island region at 800° C. to 1100° C.; and
    etching the crystallized island region, to form semiconductor layer for a thin film transistor.

6. The method of claim 1 wherein said catalyst material comprises a metal selected from the group consisting of Fe, Co, Ni, Ru, Rh, Pd, Os, Ir, Pt, Cu, Au and a combination thereof.

7. The method of claim 2 wherein said catalyst material comprises a metal selected from the group consisting of Fe, Co, Ni, Ru, Rh, Pd, Os, Ir, Pt, Cu, Au and a combination thereof.

8. The method of claim 3 wherein said catalyst material comprises a metal selected from the group consisting of Fe, Co, Ni, Ru, Rh, Pd, Os, Ir, Pt, Cu, Au.

9. The method of claim 4 wherein said catalyst material comprises a metal selected from the group consisting of Fe, Co, Ni, Ru, Rh, Pd, Os, Ir, Pt, Cu, Au and a combination thereof.

10. The method of claim 5 wherein said catalyst material comprises a metal selected from the group consisting of Fe, Co, Ni, Ru, Rh, Pd, Os, Ir, Pt, Cu, Au and a combination thereof.

11. A method according to claim 1 wherein said substrate is a quartz substrate.

12. A method for producing a semiconductor device comprising:
    forming a semiconductor film comprising silicon on an insulating surface of a substrate;
    disposing in contact with the semiconductor film a catalyst material that promotes crystallization of silicon; and
    heating the semiconductor film and the catalyst material at 800° C. to 1100° C. to crystallize or increase a crystallinity of said semiconductor film,
    wherein said substrate is a silicon wafer having an insulating layer thereon.

13. A method according to claim 2 wherein said substrate is a quartz substrate.

14. A method for producing a semiconductor device comprising:

forming a semiconductor film comprising silicon on an insulating surface of a substrate;

applying onto the semiconductor film a solution containing a catalyst material that promotes crystallization of silicon; and heating said semiconductor film and said catalyst material at 800° C. to 1100° C. to crystallize or increase a crystallinity of said semiconductor film, wherein said substrate is a silicon wafer having an insulating layer thereon.

15. A method according to claim 3 wherein said substrate is a quartz substrate.

16. A method for producing a semiconductor device comprising:

forming a semiconductor film comprising amorphous silicon on an insulating surface of a substrate;

disposing in contact with the semiconductor film a catalyst material that promotes crystallization of silicon; and heating the semiconductor film and the catalyst material at a temperature higher than a crystallization temperature of said semiconductor film by at least 200° C. to crystallize said semiconductor film, wherein said substrate is a silicon wafer having an insulating layer thereon.

17. A method of manufacturing a semiconductor device comprising the steps of:

forming a semiconductor film comprising amorphous silicon on an insulating surface over a substrate;

providing said semiconductor film with a catalyst material for promoting crystallization of said semiconductor film;

crystallizing said semiconductor film by heating said semiconductor film and said catalyst material at a temperature within a range from 800° C. to 1100° C.

18. A method of manufacturing a semiconductor device comprising the steps of:

forming a semiconductor film comprising amorphous silicon on an insulating surface over a substrate;

providing said semiconductor film with a catalyst material for promoting crystallization of said semiconductor film; and crystallizing said semiconductor film by heating said semiconductor film and said catalyst material at a temperature within a range from 800° C. to 1100° C., wherein a concentration of said catalyst material in said semiconductor film as measured by SIMS after the crystallization thereof is not larger than $5 \times 10^{19}$ atoms/cm$^3$.

19. A method according to claim 17 wherein said substrate is a quartz substrate.

20. A method of manufacturing a semiconductor device comprising:

forming a semiconductor film comprising amorphous silicon on an insulating surface of a substrate;

providing said semiconductor film with a catalyst material for promoting crystallization of said semiconductor film;

heating said semiconductor film and said catalyst material at a temperature within a range from 800° C. to 1100° C. to crystallize said semiconductor film, wherein said substrate is a silicon wafer having an insulating layer thereon.

21. A method according to claim 17 wherein said catalyst material comprises a metal selected from the group consisting of Fe, Co, Ni, Ru, Rh, Pd, Os, Ir, Pt, Cu, and Au.

22. A method of manufacturing a semiconductor device comprising the steps of:

forming a semiconductor film comprising amorphous silicon on an insulating surface over a substrate;

providing said semiconductor film with a catalyst material for promoting crystallization of said semiconductor film;

crystallizing said semiconductor film by heating said semiconductor film and said catalyst material at a temperature higher than a crystallization temperature of said semiconductor film by at least 200° C.

23. A method according to claim 22 wherein a concentration of said catalyst material in said semiconductor film as measured by SIMS after the crystallization thereof is not larger than $5 \times 10^{19}$ atoms/cm$^3$.

24. A method according to claim 22 wherein said substrate is a quartz substrate.

25. A method of manufacturing a semiconductor device comprising:

forming a semiconductor film comprising amorphous silicon on an insulating surface of a substrate;

providing said semiconductor film with a catalyst material for promoting crystallization of said semiconductor film;

heating said semiconductor film and said catalyst material at a temperature higher than a crystallization temperature of said semiconductor film by at least 200° C. to crystallize said semiconductor film, wherein said substrate is a silicon wafer having an insulating layer thereon.

26. A method according to claim 22 wherein said catalyst material comprises a metal selected from the group consisting of Fe, Co, Ni, Ru, Rh, Pd, Os, Ir, Pt, Cu, and Au.

27. A method of manufacturing a semiconductor device comprising the steps of:

forming a semiconductor film comprising amorphous silicon on an insulating surface over a substrate;

providing said semiconductor film with a catalyst material for promoting crystallization of said semiconductor film;

crystallizing the semiconductor film by heating said semiconductor film and said catalyst material at a temperature within a range from 800° C. to 1100° C.;

etching said semiconductor film into a semiconductor layer after the crystallization thereof;

introducing phosphorus into portions of said semiconductor layer; and heating said semiconductor layer to activate said phosphorus in said portions.

28. A method according to claim 27 further comprising forming a gate insulating film and a gate electrode adjacent to said semiconductor layer.

29. A method of manufacturing a semiconductor device comprising the steps of:

forming a semiconductor film comprising amorphous silicon on an insulating surface over a substrate;

providing said semiconductor film with a catalyst material for promoting crystallization of said semiconductor film;

crystallizing said semiconductor film by heating said semiconductor film and said catalyst material at a temperature within a range from 800° C. to 1100° C.;

etching said semiconductor film into a semiconductor layer after the crystallization thereof;

introducing phosphorus into first portions of said semiconductor layer at a first concentration; and introducing phosphorus into second portions of said semiconductor layer at a second concentration wherein said second concentration is larger than said first concentration, thereby forming lightly doped regions and heavily doped regions in said semiconductor layer;

heating said semiconductor layer to activate said phosphorus in said lightly doped regions and said heavily doped regions.

30. A method according to claim 29 further comprising forming a gate insulating film and a gate electrode adjacent to said semiconductor layer.

* * * * *

UNITED STATES PATENT AND TRADEMARK OFFICE
CERTIFICATE OF CORRECTION

PATENT NO. : 6,331,475 B1
DATED : December 18, 2001
INVENTOR(S) : Shunpei Yamazaki, Satoshi Teramoto, Jun Koyama and Akiharu Miyanaga It is certified that error appears in the above-identified patent and that said Letters Patent is hereby corrected as shown below:

Title page,
Insert:
-- Related U.S. Application Data
Divisional of application No. 09/026,049, filed February 19, 1998, which is a divisional of application No. 08/657,801, filed on May 31, 1996. --

Item [30], Foreign Application Priority Data, correct the dates to read:
-- July 12, 1995 (JP) ……. 7-199079
June 1, 1995 (JP) ……. 7-160002 --

Signed and Sealed this

First Day of October, 2002

Attest:

JAMES E. ROGAN
Attesting Officer       Director of the United States Patent and Trademark Office